(12) United States Patent
Marpe et al.

(10) Patent No.: US 6,900,748 B2
(45) Date of Patent: May 31, 2005

(54) METHOD AND APPARATUS FOR BINARIZATION AND ARITHMETIC CODING OF A DATA VALUE

(75) Inventors: Detlev Marpe, Berlin (DE); Heiko Schwarz, Berlin (DE); Thomas Wiegand, Berlin (DE)

(73) Assignee: Fraunhofer-Gesellschaft zur Foerderung Der Angewandten Forschung e.V., Munich (DE)

( * ) Notice: Subject to any disclaimer, the term of this patent is extended or adjusted under 35 U.S.C. 154(b) by 119 days.

(21) Appl. No.: 10/622,335

(22) Filed: Jul. 17, 2003

(65) Prior Publication Data

US 2005/0038837 A1 Feb. 17, 2005

(51) Int. Cl.[7] ................................................ H03M 7/00
(52) U.S. Cl. ............................ 341/107; 341/51; 341/52
(58) Field of Search ................................ 341/51, 52, 63, 341/65, 67, 106, 107; 382/100, 284; 360/75, 31

(56) References Cited

U.S. PATENT DOCUMENTS

| | | | | |
|---|---|---|---|---|
| 5,272,478 A | * | 12/1993 | Allen | 341/107 |
| 5,363,099 A | * | 11/1994 | Allen | 341/107 |
| 5,471,207 A | * | 11/1995 | Zandi et al. | 341/107 |
| 5,818,369 A | * | 10/1998 | Withers | 341/107 |
| 5,992,753 A | * | 11/1999 | Xu | 235/472.01 |
| 6,075,471 A | * | 6/2000 | Kimura et al. | 341/107 |
| 6,222,468 B1 | * | 4/2001 | Allen | 341/107 |
| 6,265,997 B1 | * | 7/2001 | Nomizu | 341/107 |
| 6,411,231 B1 | * | 6/2002 | Yanagiya et al. | 341/107 |
| 6,677,868 B2 | * | 1/2004 | Kerofsky et al. | 341/107 |
| 6,771,197 B1 | * | 8/2004 | Yedidia et al. | 341/107 |
| 6,812,873 B1 | * | 11/2004 | Siohan et al. | 341/107 |

OTHER PUBLICATIONS

Wiegand, Thomas, et al; "Draft ITU–T; Recommendation and Final Draft International Standard of Joint Video Specification; ITU–T Rec. H.264; ISO/IEC 1449–10 AVC"; 8th Meeting: Geneva, Switzerland, May 23–27, 2003.
Wiegand, Thomas, et al; "Overview of the H.264/AVC Video Coding Standard"; IEEE Transaction on Circuit and Systems for Video Technology, vol. 13 No. 7, Jul.
ISO/IEC 13818–2: 1995 (E) Specification, Jul.
Sullivan, Gary: "Draft Text of Recommendation H.263 Version 2 ("H.263+") for Decision"; Study Group 16—Contribution COM–999; Study Period 1997–2000.
International Organization For Standardization; Organization Normalization; "Information Technology—Coding of Audio Visual Objects—Part 2: Visual"; N4350 Dec. 2000.
Gonzales, C.A., et al; "DCT Coding for Motion Video Storage using Adaptive Arithmetic Coding"; Signal Processing: Image Communication 2 (1960); vol. 2, No. 2, pp. 145–154; Aug. 1990.

(Continued)

*Primary Examiner*—Jean Jeanglaude
*Assistant Examiner*—Lam T. Mai
(74) *Attorney, Agent, or Firm*—Glenn Patent Group; Michael A. Glenn

(57) ABSTRACT

Binarization a data value comprises binarizing the minimum of the data value and a predetermined cut-off value in accordance with a first binarization scheme, in order to yield a primary prefix. If the data value is greater than the cut-off value, binarizing a difference of the data value minus the predetermined cut-off value in accordance with a second binarization scheme to obtain a binary suffix, the first binarization scheme being different from the second binarization scheme, and appending the primary suffix to the primary prefix is performed. A very effective compression of data values may be achieve by using the binarization scheme for preparing the syntax elements for the arithmetic coding, the binarization schemes substantially being a combination of two different binarization schemes, and by using binary arithmetic coding instead of m-ary arithmetic coding for coding the binarized syntax elements.

27 Claims, 10 Drawing Sheets

OTHER PUBLICATIONS

Marpe, Detlev, et al; "Adaptive Codes for H.26L"; ITU–T Telecommunications Stardardization Sector; Video Coding Experts Group Document; Document VCEG–L13; Twelfth Meeting: Eibsee, Germany, Jan. 9–12, 2001.

Marpe, Detlev, et al; "Further Results for CABAC entropy coding scheme"; ITU–T Telecommunications Standardization Sector; Video Coding Experts Group Document; Document VCEG–M59; Thirteenth Meeting; Austin, Texas, USA Apr. 2–4, 2001.

Marpe, Detlev, et al; Improved CABAC38 ; ITU–T Telecommunications Standardization Sector; Video Coding Experts Group Document; Document VCEG–018r1; 15th Meeting: Pattava. Thailand, Dec. 4–6, 2001.

Marpe, Detlev, et al; "New Results on Improved CABAC"; Joint Video Team of ISO/IEC MEG & ITU–T VCEG, Document JVT–B101; 2nd Meeting: Geneva, CH, Jan. 29–Feb. 1, 2002.

Schwarz Heiko, et al; "Improved CABAC"; Joint Video Team of ISO/IEC MPEG & ITU–T VCEG; Document JVT–C060; 3rd Meeting: Fairfax, Virginia, USA, May 6–10, 2002.

Marpe, Detlev, et al; "Fast Arithmetic Coding for CABAC"; Joint Video Team of ISO/IEC MPEG & ITU–T VCEG; Document JVT–C060; 3rd Meeting: Fairfax, Virginia, USA, May 6–10, May 2002.

Schwarz, Heiko et al.; "CABAC and Slices"; Joint Video Team of ISO/IEC MPEG & ITU–T VCEG; Document JVT–D020rl; 4th Meeting: Klagenfurt, Austria, Jul. 22–26, 2002.

Karczewicz, Mata, et al.; "Analysis and Simplification of Intra Prediction"; Joint Video Team of ISO/IEC MPEG & ITU–T VCEG; Document JVT–D025; 4th Meeting: Klagenfurt, Austria, Jul. 22–26, 2002.

Marpe, Detlev, et al.; "Proposed Cleanup changes for CABAC"; Joint Video Team of ISO/IEC MPEG & ITU–T VCEG; Document JVT–E059; 5th Meeting: Geneva, CH, Oct. 9–17, 2002.

Bossen, Frank, "CABAC cleanup and complexity reduction"; Joint Video Team of ISO/IEC MPEG & ITU–T VCEG; Document JVT–Exxx; 5th Meeting: Geneva, Switzerland, Oct. 2002.

Marpe, Detlev, et al; "Final CABAC cleanup"; Joint Video Team of ISO/IEC MPEG & ITU–T VCEG; Document JVT–F039; 6th Meeting: Awaji, Island, JP, Dec. 5–13, 2002.

Marpe, Detlev and Hans L. Cycon; "Very Low Bit—Rate Video Coding Using Wavelet—Based Techniques"; IEEE Transactions on Circuits and Systems for Video Technology; vol. 9, No. 1, Feb. 1999.

Heising, G., et al; "Wavelet–based very low Bitrate coding using image warping"; IEE Proc.–Vis. Image Signal Process, vol. 148, No. 2, Apr. 2001.

Choi, Seung–Jong, and John W. Woods; "Motion–Compensated 3–D Subband Coding of Video"; IEEE Transactions on Image Processing, VOL 8, No. Feb. 1999.

Said, Amir and William A. Pearlman; "A new fast and efficient image codec based on set partitioning in hierarchical trees"; IEEE Int. Smyp on Circuits and Systems, Chigcago, IL May 1993.

Marpe, Detlev and Hans L. Cycon; "Efficient Pre–Coding Techniques for Wavelet–Based Image Compression"; Proc. Int. Picture Coding Symposium, pp. 45–50, 1997.

Rissanen, Jorma and Glen G. Landgon, Jr; "Universal Modeling and Coding"; IEEE Transactions on Information Theory; vol. It–27 No. 1, Jan. 1981.

Rissanen, Jorma; "Universal Coding, Information, Prediction, and Estimation"; IEEE Transactions on Information Theory; vol. It–30, No. 4, Jul. 1984.

Weinberger, Marcelo J., et al; "Applications of universal context modeling to lossless compression of grey–scale images"; IEEE Transactions on Imaging Processing; vol. 5, No. 4, Apr. 1996.

Teuhola, Jukka; "A Compression Method of Clustered Bit–Vektors"; Information Processing Letters, vol. 7, No. 6, pp. 308–311, Oct. 1978.

Gallager, Robert G. and David C. Van Voorhis; "Optimal Source Codes for Geometrically Distributed Integer Alphabets"; IEEE Transactions on Information Technology; pp. 228–230, Mar. 1975.

Mrak, Marta, et al.; "A Context Modeling Algorithm and its Application in Video Compression"; Fraunhofer–Institute HHI, Berlin, Germany Apr. 1999.

Pennebaker, W.B., et al; "An overview of the basic principles of the Q–Coder adaptive binary arithmetic coder", IBM. J. Res. Develop, vol. 32, No. 6, Nov. 1988.

Rissanen, Jorma and K. M. Mohiuddin; :A multiplication–free multialphabet arithmetic code; IEEE Transactions on Communications; vol. 37, No. 2, Feb. 1989.

Howard, Paul G. and Jeffrey Scott Viter; "Practical implementations of arithmetic code"; Brown University, Department of Computer Science, Technical Report No. 92–18; Revised version, Apr. 1992, Formerly Tecnical Report No. CS–91–45.

"Sample Data Coding"; Chapter 12, pp. 473–484, May 2001.

Moffat, Alistair, et al; "Arithmetic Coding Revisited"; ACM Transactions on Information Systems, vol. 16, No. 3, pp. 256–294, Jul. 1998.

Wiegand, Thomas, et al; "Rate–Constrained Coder Control and Comparison of Video Coding Standards"; IEEE Transactions on Circuits and Systems for VideoTechnology: vol. 13, No. 7, Jul. 2003.

Wiegand, Thomas; "Draft ITU–T Recommendation and Final Draft International Standard of Joint Video Specification (ITU–T Rec. H.264; ISO/IEC; 14496–10 AVC)"; Document: JVT–G050; 7th Meeting: Pattaya, Thailand, Mar. 7–14, 2003.

"Video Codec For Audiovisual Services at p•64 kbit/s"; International Telecommunicatin Union; H.261 (Mar. 1993).

Wenger, Stephen; "H.264/AVC Over IP"; IEEE Transactions on Circuits and Systems for VideoTechnology; vol. 13, No. 7, Jul. 2003.

Stockhammer, Thomas, et al; "H.264/AVCinWireless Environments"; IEEE Transactions on Circuits and Systems for VideoTechnology; vol. 13, No. 7, Jul. 2003.

Wedi, Thomas and Hans Georg Musmann; "Motion–and Aliasing–Compensated Prediction for Hybrid Video Coding"; IEEE Transactions on Circuits and Systems for Video-Technology; vol. 13, No. 7, Jul. 2003.

Wiegand, Thomas, et al; "Long Term Memory Motion–Compensated Prediction"; IEEE Transactions on Circuits and Systems of VideoTechnology; vol. 9, No. 1, Feb. 1999.

Flierl, Markus, et al; "A locally design algorithm block–based multi–hypothesis motion–compensated prediction"; Proceedings of the IEEE DCC, pp. 239–248, Snowbird, Utah; Mar. 1988.

Flierl, Markus and Bernd Girod; "Generalzied B Pictures and the Draft H.264/AVC Codec"; IEEE Transactions on Circuits and Systems for VideoTechnology; vol. 13, No. 7, Jul. 2003.

Wiegand, Thomas, et al; "Rate–Constrained Coder Control and Comparison of Video Coding Standards"; IEEE Transactions on Circuits and Systems for VideoTechnology; vol. 13, No. 7, Jul. 2003.

Karczewicz, Marta and Ragip Kurceren; "The SP—SI—Frames Design for H.264/AVC"; IEEE Transactions on Circuits and Systems for VideoTechnology; vol. 13, No. 7, Jul. 2003.

Marpe, Detlev et al; "Context/Based Adaptive Binary Arithmetic Coding in the H.264/AVC Video Compression Standard"; IEEE Transactions on Circuits and Systems for VideoTechnology; vol. 13, No. 7, Jul. 2003.

Malvar, Henrique S. et al; "Low–complexity Transformed Quantization in H.264/AVC"; IEEE Transactions on Circuits and Systems for VideoTechnology; vol. 13, No. 7, Jul. 2003.

List, Peter, et al; "Adaptive Deblocking Filter"; IEEE Transactions on Circuits and Systems for VideoTechnology; vol. 13, No. 7, Jul. 2003.

Ribas–Cobera, Jordi et al; "A Generalized Hypothetical Reference Decoder for H.264/AVC"; IEEE Transactions on Circuits and Systems for VideoTechnology; vol. 13, No. 7, Jul. 2003.

Marpe, Detlev et al; "Proposed Editorial Changes and Cleanup of CABAC"; Joint Video Team of ISO/IEC MPEG & ITU–T VCEG: Document JVT–D019; 4th Meeting: Klagenfurt, Austria, Jul. 22–26, 2002.

Wiegand, Thomas; "Study of Final Committee Draft of Joint Video Specification (ITU–T Rec. H.264, ISO/IEC 14496–10 AVC0)"; Joint Video Team of ISO/IEC MPEG & ITU–T VCEG: Document JVT–F100d2; 6th Meeting: Awaji, Island, JP, Dec. 5–13, 2002.

The Concept of a Random Variable, pp. 82–84. Apr. 1996.

Marpe, Detlev, et al; "Improved CABAC"; ITU—Telecommunications Standardization Sector; VCEG–018r1; 15th Meeting: Pattaya, Thailand, Dec. 4–6, 2001.

\* cited by examiner

| Abs. value | Bin string | | | | | | | | | | | | | | | | | | |
|---|---|---|---|---|---|---|---|---|---|---|---|---|---|---|---|---|---|---|---|
| | TU prefix | | | | | | | | | | | | | | EG0 suffix | | | | |
| 1 | 0 | | | | | | | | | | | | | | | | | | |
| 2 | 1 | 0 | | | | | | | | | | | | | | | | | |
| 3 | 1 | 1 | 0 | | | | | | | | | | | | | | | | |
| 4 | 1 | 1 | 1 | 0 | | | | | | | | | | | | | | | |
| 5 | 1 | 1 | 1 | 1 | 0 | | | | | | | | | | | | | | |
| ... | | | | | | | | | | | | | | | | | | | |
| ... | | | | | | | | | | | | | | | | | | | |
| 13 | 1 | 1 | 1 | 1 | 1 | 1 | 1 | 1 | 1 | 1 | 1 | 1 | 0 | | | | | | |
| 14 | 1 | 1 | 1 | 1 | 1 | 1 | 1 | 1 | 1 | 1 | 1 | 1 | 1 | 0 | | | | | |
| 15 | 1 | 1 | 1 | 1 | 1 | 1 | 1 | 1 | 1 | 1 | 1 | 1 | 1 | 1 | 0 | | | | |
| 16 | 1 | 1 | 1 | 1 | 1 | 1 | 1 | 1 | 1 | 1 | 1 | 1 | 1 | 1 | 1 | 0 | 0 | | |
| 17 | 1 | 1 | 1 | 1 | 1 | 1 | 1 | 1 | 1 | 1 | 1 | 1 | 1 | 1 | 1 | 0 | 1 | | |
| 18 | 1 | 1 | 1 | 1 | 1 | 1 | 1 | 1 | 1 | 1 | 1 | 1 | 1 | 1 | 1 | 1 | 0 | 0 | 0 |
| 19 | 1 | 1 | 1 | 1 | 1 | 1 | 1 | 1 | 1 | 1 | 1 | 1 | 1 | 1 | 1 | 1 | 0 | 0 | 1 |
| 20 | 1 | 1 | 1 | 1 | 1 | 1 | 1 | 1 | 1 | 1 | 1 | 1 | 1 | 1 | 1 | 1 | 0 | 1 | 0 |
| ... | | | | | | | | | | | | | | | | | | | |
| bin | 1 | 2 | 3 | 4 | 5 | 6 | 7 | 8 | 9 | 10 | 11 | 12 | 13 | 14 | 15 | 16 | 17 | 18 | 19 ... |

Fig. 5

| Abs. value | Bin string — TU prefix | EG3 suffix |
|---|---|---|
| 0 | 0 | |
| 1 | 1 0 | |
| 2 | 1 1 0 | |
| ... | | |
| 7 | 1 1 1 1 1 1 0 | |
| 8 | 1 1 1 1 1 1 1 0 | |
| 9 | 1 1 1 1 1 1 1 1 | 0 0 0 0 |
| 10 | 1 1 1 1 1 1 1 1 | 0 0 0 1 |
| 11 | 1 1 1 1 1 1 1 1 | 0 0 1 0 |
| ... | | |
| 16 | 1 1 1 1 1 1 1 1 | 0 1 1 1 |
| 17 | 1 1 1 1 1 1 1 1 | 1 0 0 0 0 0 |

Fig. 6

METHOD AND APPARATUS FOR BINARIZATION AND ARITHMETIC CODING OF A DATA VALUE

BACKGROUND OF THE INVENTION

I. Technical Field of the Invention

The present invention is related to binarization schemes and coding schemes, in general, and in particular, to binarization and arithmetic coding schemes for use in video coding applications.

II. Description of the Prior Art

Entropy coders map an input bit stream of binarizations of data values to an output bit stream, the output bit stream being compressed relative to the input bit stream, i.e., consisting of less bits than the input bit stream. This data compression is achieved by exploiting the redundancy in the information contained in the input bit stream.

Entropy coding is used in video coding applications. Natural camera-view video signals show non-stationary statistical behavior. The statistics of these signals largely depend on the video content and the acquisition process. Traditional concepts of video coding that rely on mapping from the video signal to a bit stream of variable length-coded syntax elements exploit some of the non-stationary characteristics but certainly not all of it. Moreover, higher-order statistical dependencies on a syntax element level are mostly neglected in existing video coding schemes. Designing an entropy coding scheme for video coder by taking into consideration these typical observed statistical properties, however, offer significant improvements in coding efficiency.

Entropy coding in today's hybrid block-based video coding standards such as MPEG-2 and MPEG-4 is generally based on fixed tables of variable length codes (VLC). For coding the residual data in these video coding standards, a block of transform coefficient levels is first mapped into a one-dimensional list using an inverse scanning pattern. This list of transform coefficient levels is then coded using a combination of run-length and variable length coding. The set of fixed VLC tables does not allow an adaptation to the actual symbol statistics, which may vary over space and time as well as for different source material and coding conditions. Finally, since there is a fixed assignment of VLC tables and syntax elements, existing inter-symbol redundancies cannot be exploited within these coding schemes.

It is known, that this deficiency of Huffman codes can be resolved by arithmetic codes. In arithmetic codes, each symbol is associated with a respective probability value, the probability values for all symbols defining a probability estimation. A code word is coded in an arithmetic code bit stream by dividing an actual probability interval on the basis of the probability estimation in several sub-intervals, each sub-interval being associated with a possible symbol, and reducing the actual probability interval to the sub-interval associated with the symbol of data value to be coded. The arithmetic code defines the resulting interval limits or some probability value inside the resulting probability interval.

As may be clear from the above, the compression effectiveness of an arithmetic coder strongly depends on the probability estimation and the symbols, which the probability estimation is defined on. The symbols may be the data values in the input bit stream or the syntax elements in the input bit stream. In this case, the binarization of the data values is not critical.

SUMMARY OF THE INVENTION

It is the object of the present invention to provide a binarization scheme and coding scheme, which enable effective compression of data values, such as transform coefficient level values or components of motion vector differences in video signals, with moderate computational overhead.

In accordance with the first aspect of the present invention, this object is achieved by a method for binarizing a data value, the method comprising the steps of binarizing the minimum of the data value and a predetermined cut-off value in accordance with a first binarization scheme, in order to yield a primary prefix, and, if the data value is greater than the cut-off value, binarizing a difference of the data value minus the predetermined cut-off value in accordance with a second binarization scheme to obtain a binary suffix, the first binarization scheme being different from the second binarization scheme, and appending the primary suffix to the primary prefix.

In accordance with the second aspect of the present invention, this object is achieved by a method for recovering a data value from a binarized representation of the data value, the binarized representation of the data value being a codeword having a primary prefix, which is a binarization of the minimum of the data value and a predetermined cut-off value in accordance with a first binarization scheme and, if the data value is greater than the predetermined cut-off value, a primary suffix appended to the primary prefix, the primary suffix being a binarization of the difference of the data value minus the predetermined cut-off value in accordance with a second binarization scheme, the method comprising extracting, from the primary prefix, the minimum, and, if the minimum is equal to the cut-off value, extracting, from the primary suffix, the difference from the data value minus the predetermined cut-off value. Then, the predetermined cut-off value is added to the difference, to obtain the data value, and, if the minimum is smaller than the cut-off value, the minimum is regarded as the data value.

In accordance with the third aspect of the present invention, this object is achieve by a method for arithmetically coding a data value into a coded bit stream, the method comprising binarizing the minimum of the data value and a predetermined cut-off value in accordance with a first binarization scheme, in order to yield a primary prefix, and, if the data value is greater than the cut off value, binarizing a difference of the data value minus the predetermined cut-off value in accordance with a second binarization scheme to obtain a binary suffix, the first binarization scheme being different from the second binarization scheme, and appending the primary suffix to the primary prefix. Then, for each bit in the codeword, if the bit of the code word is part of the primary prefix, binary arithmetically coding the bit by means of a adaptively varying bit value probability estimation, or, if the bit of the code word is part of the primary suffix, binary arithmetically coding the bit by means of a static bit value probability estimation, is performed, thereby obtaining the coded bit stream.

In accordance with the third aspect of the present invention, this object is achieved by a method for decoding a coded bit stream which represents a binarized representation of the data value, the binarized representation of the data value being a codeword having a primary prefix, which is a binarization of the minimum of the data value and a predetermined cut-off value in accordance with a first binarization scheme and, if the data value is greater than the predetermined cut-off value, a primary suffix appended to the primary prefix, the primary suffix being a binarization of the difference of the data value minus the predetermined cut-off value in accordance with a second binarization scheme, the method comprising, for each bit in the codeword, if the bit of the codeword is part of the primary prefix, determining the bit by binary arithmetically decoding the coded bit stream by means of a adaptively varying bit value probability estimation, and, if the bit of the codeword is part of the primary suffix, determining the bit by binary arithmetically decoding the bit by means of a static bit value probability estimation, thereby obtaining the codeword. Then, the minimum is extracted from the primary prefix. If the minimum is equal to the cut-off value, the difference from the data value minus the predetermined cut off value is extracted from the primary suffix and the predetermined cut-off value is added to the difference, to obtain the data value. If the minimum is smaller than the cut-off value, the minimum is regarded as the data value.

The present invention is based on the finding that a very effective compression of data values, and, in particular, of components of motion vector differences or transform coefficient of level values, forming syntax elements in a video signal, may be achieved by using a binarization scheme for preparing the syntax elements for the arithmetic coding, the binarization scheme substantially being a combination of two different binarization schemes, and by using binary arithmetic coding instead of m-ary arithmetic coding for coding the binarized syntax elements.

The advantage of using a binary arithmetic coding engine instead of a m-ary arithmetic coder operating on an original m-ary source alphabet is that the complexity of the probability estimation is reduced since the determination of the probabilities for the two possible bit values can be defined by just one probability estimation value. Adaptive m-ary arithmetic coding, for m<2, would be in general a computationally complex operation requiring at least two multiplications for each symbol to encode as well as a number of fairly complex operations to perform the update of the probability estimation.

Furthermore, binary arithmetic coding enables context modeling on a sub-symbol level. For specific bins, i.e., the nodes in a binarization code tree of the binarization scheme by which the data value to be coded is binarized, conditional probabilities can be used. These specific bins will be, in general, the most frequently observed bins. Other, usually less frequently observed bins, can be treated using a joint, typically zero-order probability model.

The use of the inventive binarization scheme enables, in connection with binary arithmetic coding, an effective way of adapting the binarization representation of the data value to the probability distribution of the data values. A suitably selected cut-off value may lead to the least probable data values to be binarized into code words having equally probable bit values, whereas the most probable data values may be binarized into code words leading to a very effective arithmetic coding bit stream when using adaptive context modeling. Thus, coding based on a static probability estimation may be employed for the second binarization scheme suffix of the code word, whereas adaptive binary arithmetic coding is effectively applied to bits of the first binarization scheme primary prefix of the code word.

In accordance with a specific embodiment of the present invention, a concatenation of a truncated unary binarization scheme and a $k^{th}$ order exponential Golomb binarization scheme is used. This concatenated scheme, which is referred to as unary/$k^{th}$ order Exp-Golomb (UEGk) binarization, is applied to motion vector differences and absolute values of transform coefficient levels. The design of these concatenated binarization schemes is motivated by the following observations. First, the unary code is the simplest prefix-free code in terms of implementation cost. Secondly, it permits a fast adaptation of the individual symbol probabilities in a subsequent context modeling stage, since the arrangement of the nodes in the corresponding tree is typically such that with increasing distance of the internal nodes from the root node the corresponding binary probabilities are less skewed. These observations are accurate for small values of the absolute motion vector differences and transform coefficient levels. For larger values, there is not much use of an adaptive modeling having led to the idea of concatenating an adapted truncated unary tree as a prefix and a static Exp-Golomb code tree as a suffix. Typically, for larger values, the EGk suffix part represents already a fairly good fit to the observed probability distribution, as already mentioned above.

SHORT DESCRIPTION OF THE DRAWINGS

Preferred embodiments of the present invention are described in more detail below with respect to the figures.

Figure 10:
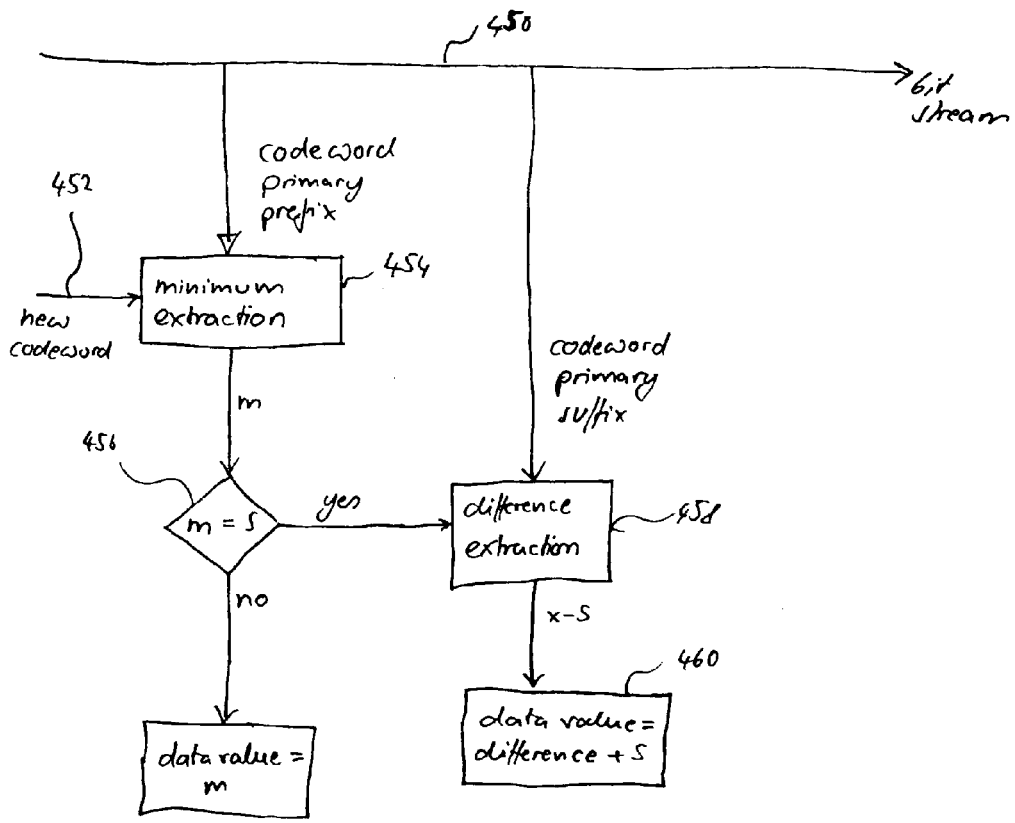
Figure 3:
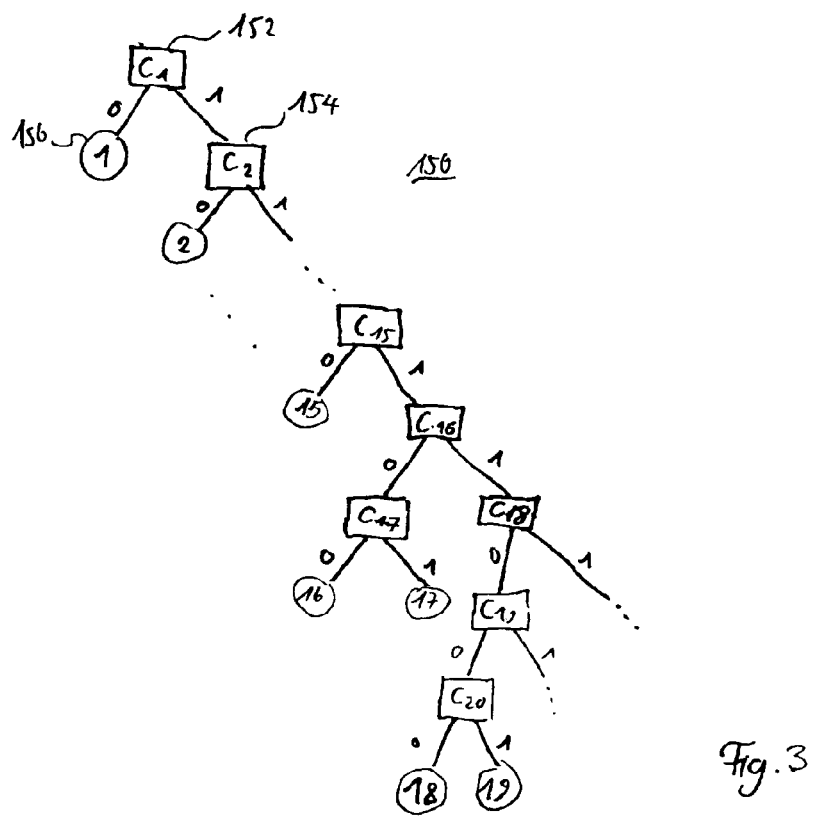
Figure 4:
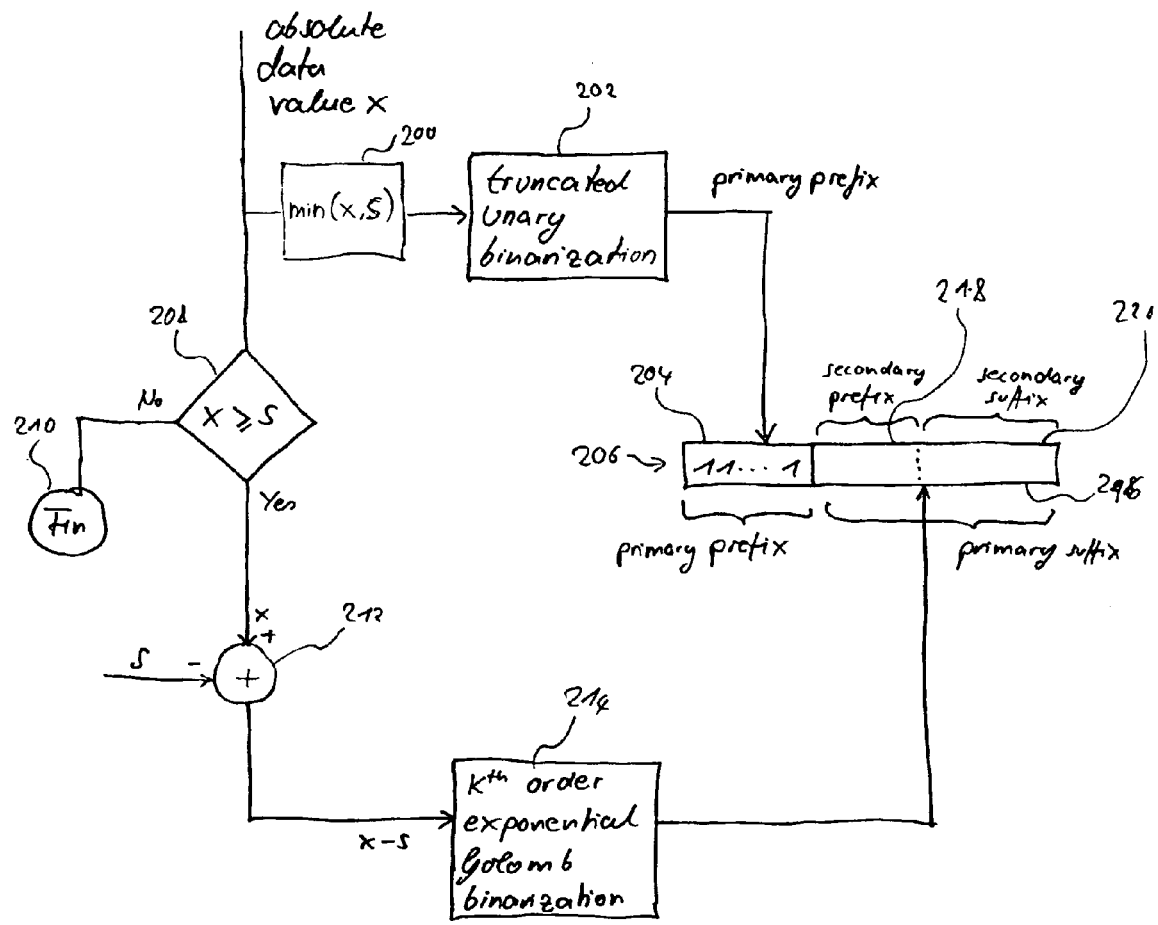
Figure 7:
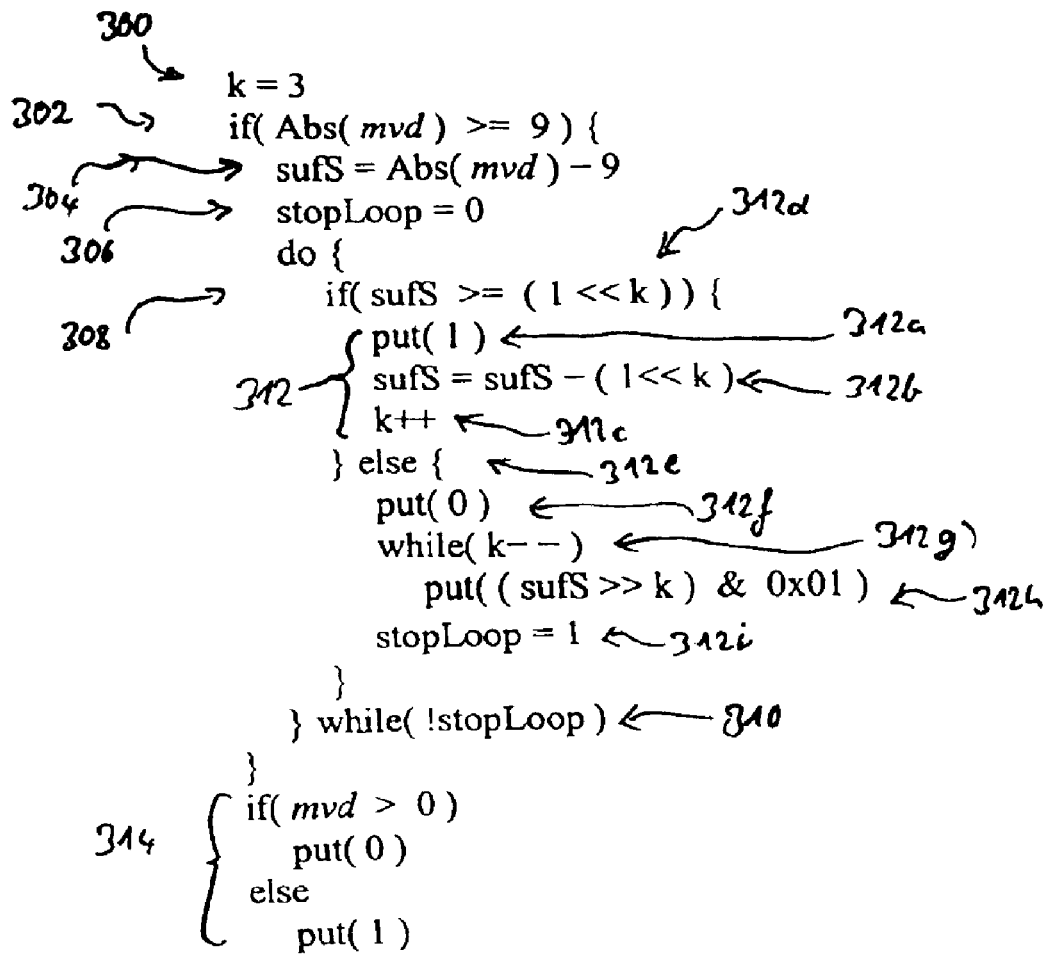
Figure 8:
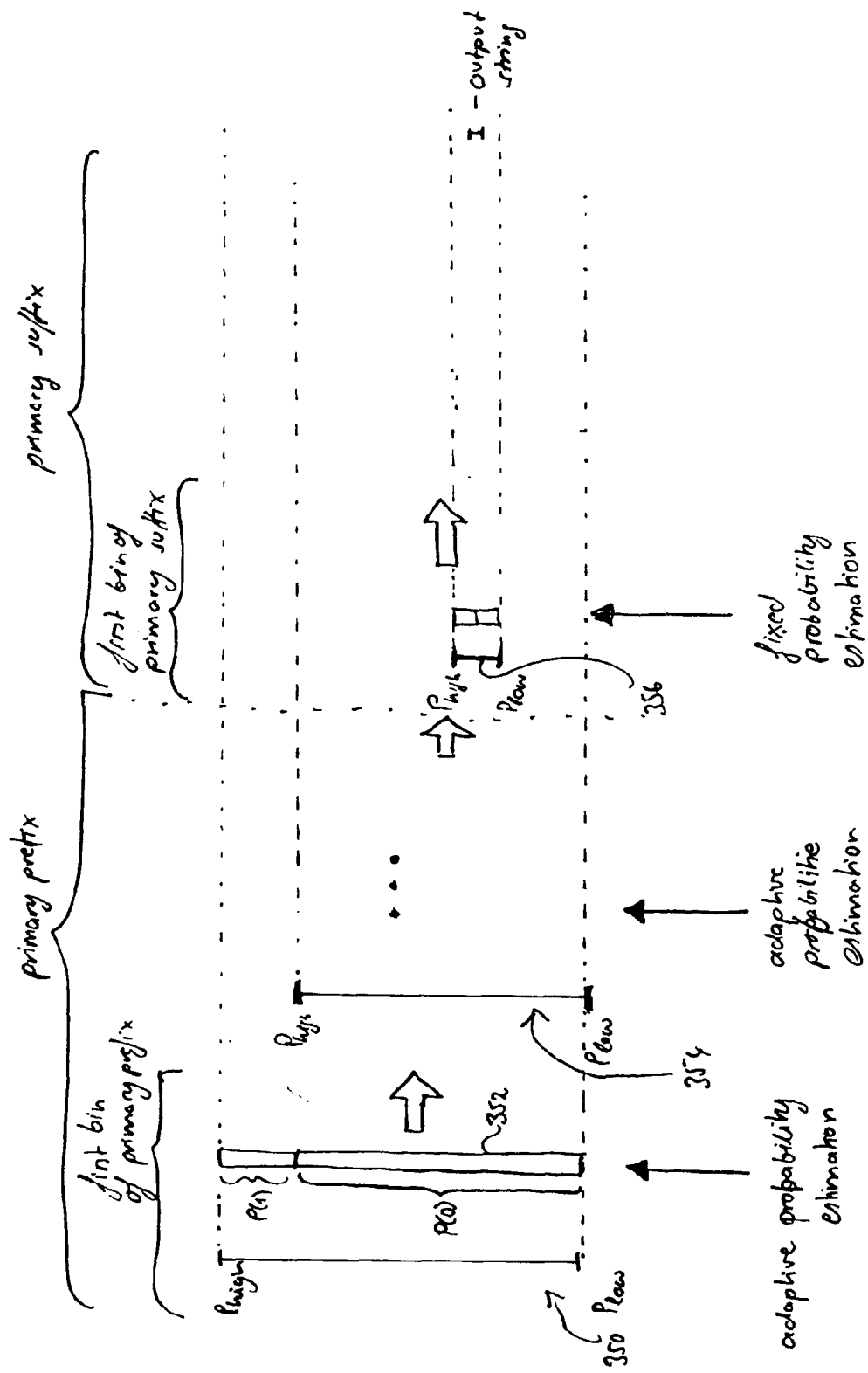
Figure 9:
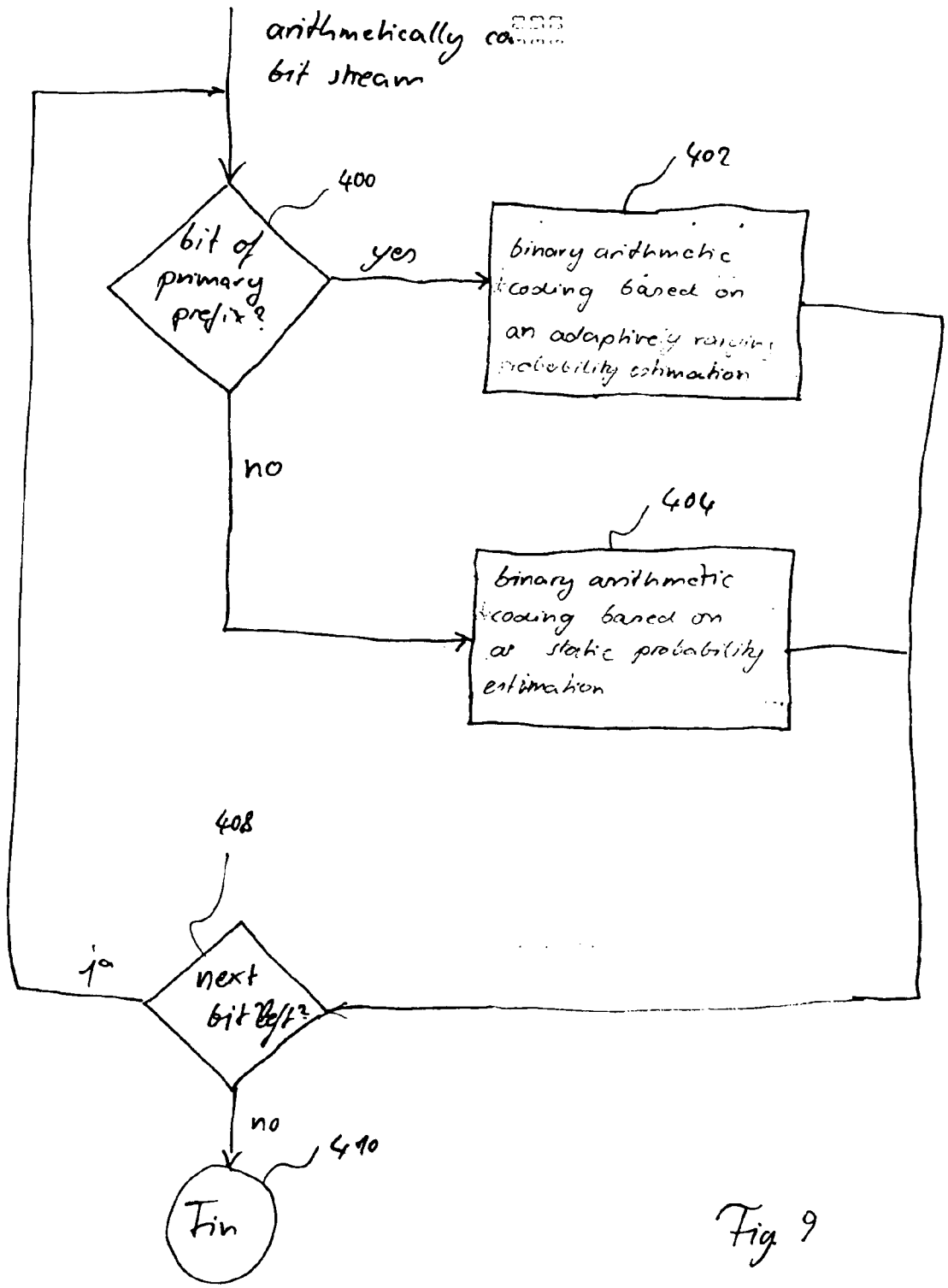
Figure 11:
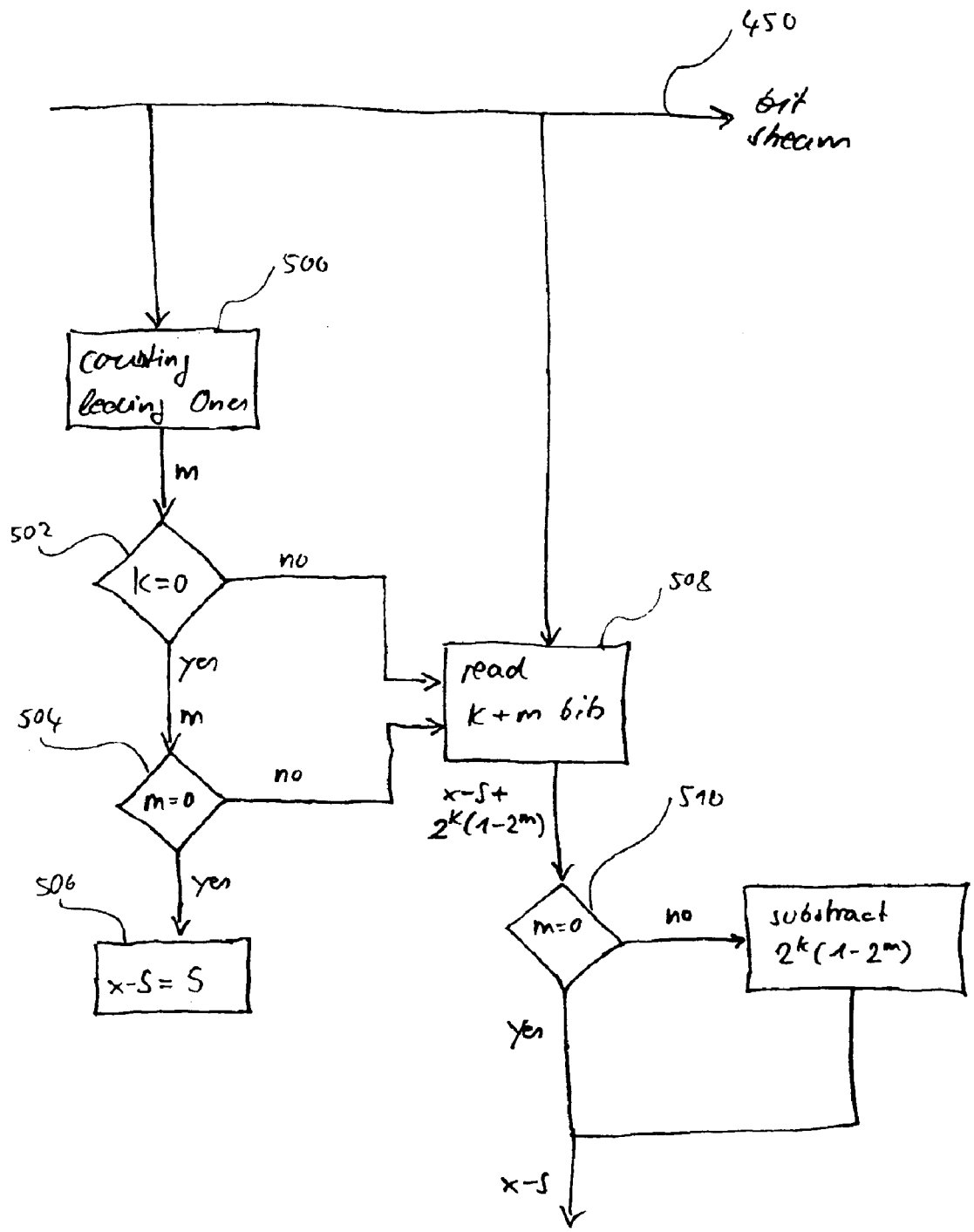

FIG. 3 a part of the binarization coding tree related to the binarization scheme FIG. 5;

FIG. 4 a schematic diagram illustrating the binarization of an absolute data value in accordance with an embodiment of the present invention;

FIG. 5 a table showing bin strings into which an absolute value is binarized in accordance with a further embodiment of the present invention;

FIG. 6 a table showing bin strings into which an absolute value is binarized in accordance with a further embodiment of the present invention;

FIG. 7 shows a pseudo-C code for performing a binarization in accordance with a further embodiment of the present invention;

FIG. 8 a schematic diagram illustrating binary arithmetic coding in accordance with an embodiment of the present invention;

FIG. 9 shows a schematic diagram illustrating the decoding of an arithmetically coded bit stream into a data value in accordance with an embodiment of the present invention;

FIG. 10 shows a schematic diagram illustrating the recovering of a data value from a binarization of the data value in accordance with an embodiment of the present invention;

FIG. 11 shows a schematic diagram illustrating the extraction with regard to the suffix part in the process of FIG. 10.

Figure 12:
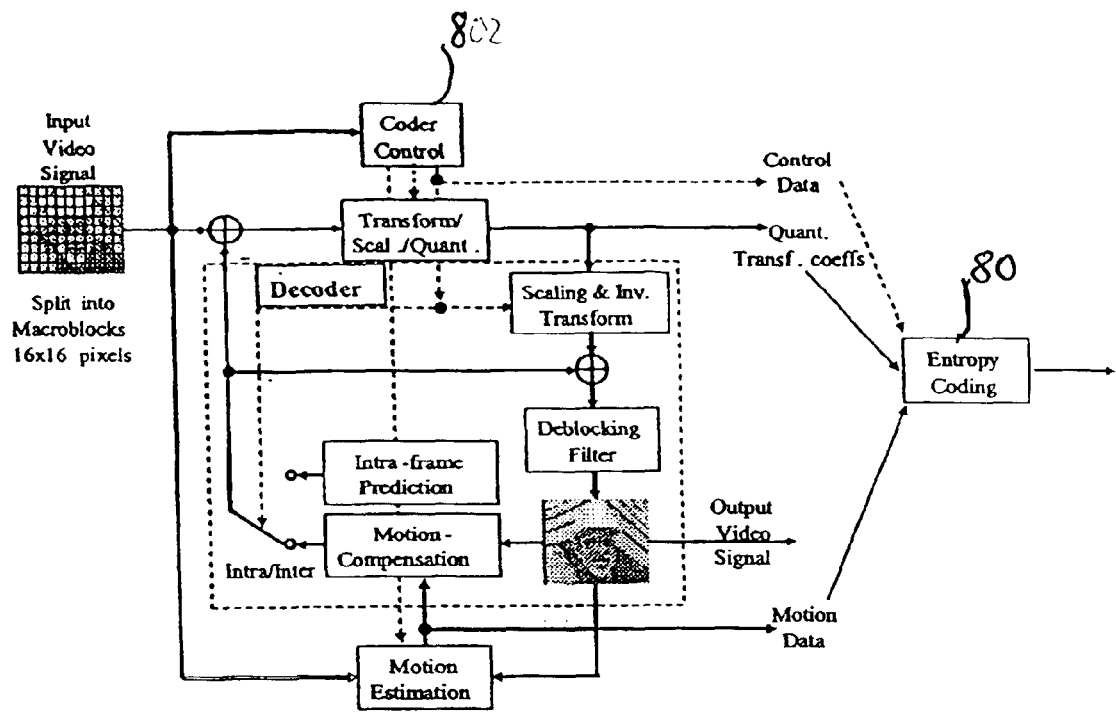
Figure 13:
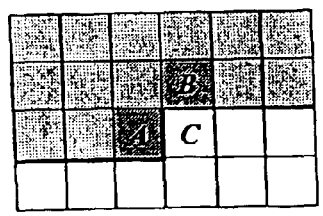
Figure 14:
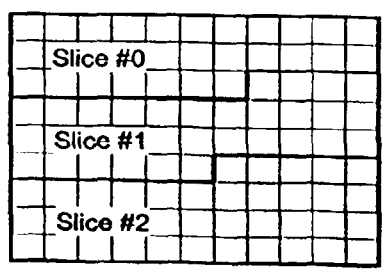

FIG. 12 shows a basic coding structure for the emerging H.264/AVC video encoder for a macro block;

FIG. 13 illustrates a context template consisting of two neighboring syntax elements A and B to the left and on top of the current syntax element C;

FIG. 14 shows an illustration of the subdivision of a picture into slices; and

Figure 15:
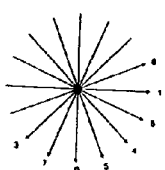

FIG. 15 shows, to the left, intra_4×4 prediction conducted for samples a–p of a block using samples A_Q, and to the right, "prediction directions for intra_4×4 prediction

DETAILED DESCRIPTION OF A PREFERRED EMBODIMENT OF THE PRESENT INVENTION

The present invention is described in the following with respect to video coding, although the present invention may also be used advantageously in other applications, such as audio coding, compressed simulation data or the like.

Figure 1:
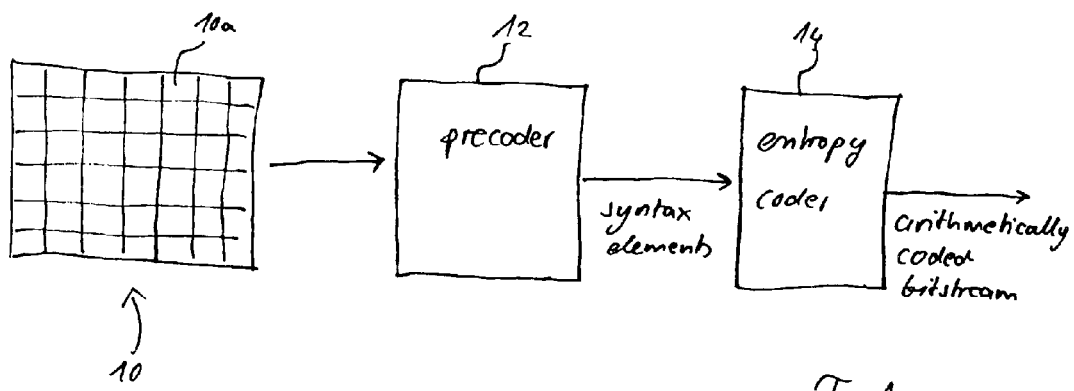
FIG. 1 shows a high-level block diagram of a coding environment in which the present invention may be employed.

FIG. 1 shows a general view of an video coder environment to which the present invention could be applied. A picture 10 is fed to a video precoder 12. The video precoder treats the picture 10 in units of so called macro blocks 10a. On each macro block a transformation into transformation coefficients, is performed followed by a quantization into transform coefficient levels. Moreover intra-frame prediction or motion-compensation is used in order not to perform the aforementioned steps directly on the pixel data but on the differences of same to predicted pixel values, thereby achieving small values which are more easily compressed.

The macroblocks into which the picture 10 is partitioned are grouped into several slices. For each slice a number of syntax elements are generated which form a coded version of the macroblocks of the slice. These syntax elements are dividable into two categories. The first category contains the elements related to macroblock type, sub-macroblock type and information of prediction modes both of spatial and of temporal types as well as slice-based and macroblock-based control information, such as components of motion vector differences, which are prediction residuals. In the second category, all residual data elements, i.e. all syntax elements related to the coding of transform coefficients are combined, such as a significance map indicating the locations of all significant coefficients inside a block of quantized transform coefficient, and the values of the significant coefficients which are indicated in units of levels corresponding to the quantization steps.

Figure 2:
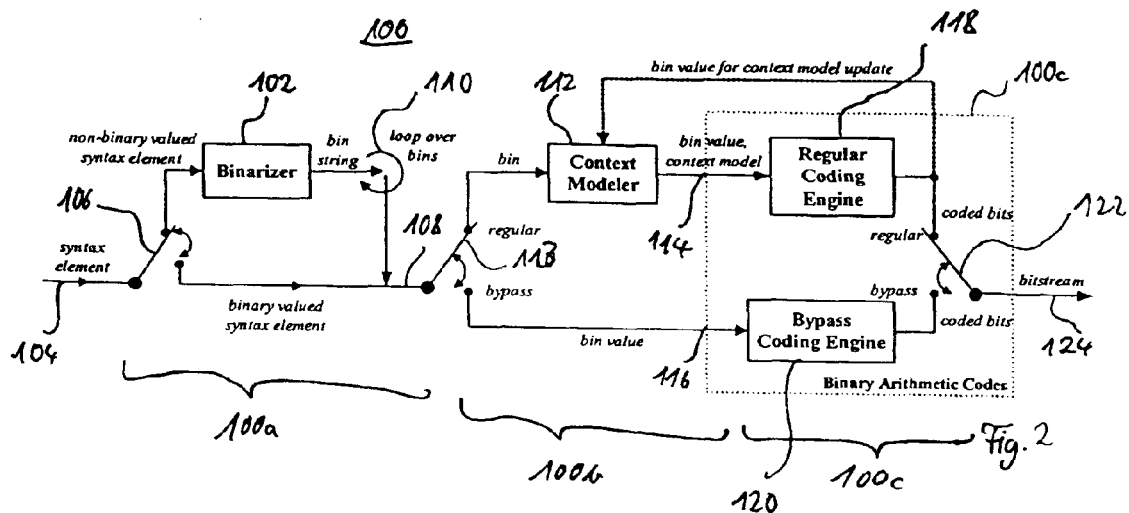
FIG. 2 shows a block diagram of the part of the coding environment of FIG. 1, in which the binarization and binary arithmetic coding takes place, in accordance with an embodiment of the present invention.

The precoder 12 transfers the syntax elements to a final coder stage 14 which is a entropy coder and explained in more detail with respect to FIG. 2. Each syntax element is a data value having a certain meaning in the video signal bit stream that is passed to the entropy coder. The entropy coder 14 outputs a final compressed video bit stream.

FIG. 2 shows the arrangement for coding the syntax elements into the final arithmetic code bit stream, the arrangement generally indicated by reference number 100. The coding arrangement 100 is divided into three stages 100a, 100b, and 100c.

The first stage 100a is the binarization stage and comprises a binarizer 102. An input of the binarizer 102 is connected to an input 104 of stage 100a via a switch 106. At the same time, input 104 for the input of coding arrangement 100. The output of binarizer 102 is connected to an output 108 of stage 100a, which, at the same time, forms the input of stage 100b. The switch 106 is able to pass syntax elements arriving at input 104 to either binarizer 102 or binarization stage output 108, thereby bypassing binarizer 102.

The function of switch 106 is to directly pass the actual syntax element at input 104 to the binarization stage output 108 if the syntax element is already in a wanted binarized form. For the following discussion, it is assumed that the syntax element is not in the correct binarization form and therefore, syntax elements are generally thought to be non-binary valued syntax elements. The non-binary valued syntax elements are passed via switch 106 to binarizer 102. Binarizer 102 maps the non-binary valued syntax elements to a code word, or a so called bin string, in accordance with a binarization scheme embodiments of which are described below with respect to the following figures. The meaning of bin will be described in more detail below with respect to FIG. 3.

The code words output by binarizer 102 may not be passed directly to binarization stage output 108 but controllably passed to output 108 by a bin loop over means 110 arranged between the output of binarizer 102 and output 108 in order to merge the bin strings output by binarizer 102 and the already binary valued syntax elements bypassing binarizer 102 to a single bit stream at binarization stage output 108.

As is described in more detail below, the binarization stage 108 is for transferring the syntax elements into a suitable binarized representation, which is adapted to the probability distribution of the syntax elements and thereby enabling very efficient binary arithmetic coding of these binarized syntax elements by applying context modeling, i.e., varying the bit value probability estimation, with respect to only a small part of the bits, as will be described in more detail below.

Stage 100b is a context modelling stage and comprises a context modeler 112 as well as a switch 110. The context modeler 112 comprises an input, an output and an optional feed-back input. The input of context modeler 112 is connected to the stage output 108 via switch 110. The output of context modeler 112 is connected to a regular coding input terminal 114 of stage 100c. The function of switch 113 is to pass the bits or bins of the bin string at binarization stage output 108 to either the context modeler 112 or to a bypass coding input terminal 116 of stage 100c, thereby bypassing context modeler 112.

In order to ease the understanding of the preferred embodiments of the present invention, in the following only those parts of the bit stream at binarization stage output 108 are discussed, which correspond to bin strings created from absolute values of transform coefficient levels or motion vector differences. Motion vectors are 2-dimensional vectors used for interprediction that provide an off-set from the coordinates in the decoded picture to the coordinates in a reference picture. The motion vector difference represents the prediction error at quarter-sample accuracy. Nevertheless, the embodiments described herein with respect to the figures could also be applied to other syntax elements.

When receiving the bin string or codeword of a component of a motion vector difference or a transform coefficient level, it is the function of switch 113 to direct the bits of the codeword to either the context modeler 112 or the bypass input terminal 116 depending on to whether the bit belongs to a primary prefix part or a primary suffix part of the code word, as will be described in more detail below.

The context modeler 12 adapts an actual bit or bin value probability distribution estimation in accordance with a predetermined context model type which is associated with that bit or bin. The estimation adaptation or estimation update is based on past or prior bits values which the context modeler 112 may receive at the feedback input from stage 100c or may temporarily store. The context model type defines which of the past bits or bins influence the estimation adaptation, such as the bins of a neighboring pixel syntax element or the bin before the actual bin. The context modeler 12 passes the bits further to arithmetic coding stage 100c together with the new adaptively varied bit value probability distribution estimation, whereby the context modeler 112 drives the arithmetic coding stage 100c to generate a sequence of bits as a coded representation of the syntax elements according to the adaptive bit value probability distribution estimation.

It is clear from the above, that the probability estimation determines the code and its efficiency in the first place, and that it is of paramount importance to have an adequate model that exploits the statistical dependencies of the syntax elements to a large degree and that this probability estimation or context model is kept up-to-date during encoding. However, there are significant model costs involved by additively estimating higher order conditional probabilities. Therefore, the binarization schemes of the embodiments described below are adapted to the statistics of the syntax elements such that context modeling leads to a efficient compression ratio even if context modeling is performed merely with respect to certain bits or bins of the binarized syntax elements at binarization stage output 108. With respect to the other bits, it is possible to use a static probability estimation and therefore reduce significantly the model costs, whereas the compression efficiency is affected merely to a moderate extent.

The third stage 100c of coding arrangement 100 is the arithmetic coding stage. It comprises a regular coding engine 118, a bypass coding engine 120, and a switch 122. The regular coding engine 118 comprises rises an input and an output terminal. The input terminal of regular coding engine 118 is connected to the regular coding input terminal 114. The regular coding engine 118 binary arithmetically codes the bin values passed from context modeler 112 by use of the context model also passed from context modeler 112 and outputs coded bits. Further, the regular coding engine 118 eventually passes bin values for context model updates to the feedback input of context modeler 112.

The bypass coding engine 112 has also an input and an output terminal, the input terminal being connected to the bypass coding input terminal 116. The bypass coding engine 120 is for binary arithmetically coding the bin values passed directly from binarization stage output 108 via switch 113 by use of a static predetermined probability distribution estimation and also outputs coded bits.

The coded bits output from regular coding engine 218 and bypass coding engine 120 are merged to a single bit stream at an output 124 of coding arrangement 100 by switch 122, the bit stream representing a binary arithmetic coded bit stream of the syntax element as input in input terminal 104. Thus, regular coding engine 118 and bypass coding 120 cooperate in order to bit wise perform arithmetical coding based on either an adaptive or a static probability distribution model.

In order to illustrate the relation between "bits" of the codewords to which binarizer 102 maps the syntax elements, on the one hand, and "bins", on the other hand, FIG. 3 shows a binary code tree corresponding to the binarization scheme later described with respect to FIG. 5. The code tree, generally indicated with reference number 150 comprises a root node 152 and several internal nodes 154, the root node 152 and the internal node 154 being designated by Ci, with the index i being an integer associated with a corresponding node. Each of these nodes defines a conditional branch or binary decision called a "bin", with a left branch corresponding to the bin value and the right branch corresponding to the bin value 1.

The tree 150 also includes terminal nodes 156. The numbers assigned to the terminal nodes 156 in FIG. 3 correspond to the data value of the syntax element, which, in accordance with the binarization scheme of FIG. 5, corresponds to the codeword or bit string resulting form the bits or bin values, when following the path from root node 152 to the respective terminal node 156. For example, the data value 17 corresponds, as shown in FIG. 5, to the codeword bit string 11111111111111101. The path comprises root node 152 and the internal nodes 154 $C_2$ to $C_{17}$. Each node 152 or 154 may be seen as a binary decision called "bin". The concatenation of the binary decision for traversing the tree 150 from the root node 152 to the respective terminal node 156 represents the "bin string" of the corresponding symbol value or syntax element value.

Each binary decision has an actual probability distribution indicating the probability as to whether the decision yields a binary zero (left branch in FIG. 3) and a binary one (right branch in FIG. 3). In other words, the actual probability distribution of a binary decision defines the probability that the syntax element path takes the zero or one branch at this binary decision. Accordingly, the actual probability for the syntax element to assume a certain data value is equal to the product of the respective probabilities at the nodes arranged along the path from root node 152 to the respective terminal node 156.

For binary arithmetic coding, each binary decision or node 152, 154 of tree 156, i.e. each bin, is associated with a bit value probability estimation or a context model, i.e. $C_1$. As is described in more detail below, not all of the nodes or bins is associated with adaptive probability estimation models but may be associated with a static probability estimation, thereby reducing the context modeling overhead, i.e. the management for adapting the estimation according to past bins in order to increase the compression ratio.

Next, with respect to FIG. 4, an embodiment of a binarization scheme in accordance with an embodiment of the present invention is described. FIG. 4 shows schematically the steps binarizer 102 performs on the non-binary valued syntax elements. In particular, FIG. 4 is an embodiment for binarizing the absolute values of transform coefficient levels, i.e., an integer quantity representing the value associated with a particular two-dimensional frequency index in the decoding process prior to scaling for computation of a transform coefficient value.

The binarization scheme of FIG. 4 is a concatenation of a truncated unary binarization scheme, on the one hand, and a $k^{th}$ order Exp-Golomb binarization scheme, on the other hand. A truncated unary binarization scheme is based a unary binarization scheme. In accordance with an unary binarization scheme, for each unsigned integer valued symbol x greater than or equal to zero the unary codeword to which x is mapped consists of x "1" bits plus a terminating "0" bit. Differing from the unary binarization scheme, a truncated unary (TU) code is only defined for x with $0 \leq x \leq S$, where for x<S the code is given by the unary code, whereas for x=S the terminating "0" bit is neglected such that the TU code of x=S is given by a codeword consisting of x "1" bits only, i.e. without a terminating bit of "0". In accordance with the exponential Golomb binarization scheme, generally, a data value x is mapped to a code consisting of a prefix and a suffix. More precisely, in accordance with the $k^{th}$ order Exp-Golomb binarization scheme, data values are mapped to code words having at least a prefix and, depending on the data value, a suffix. The prefix part of the EGk code word consists of a unary code corresponding to the value l(x), with $l(x) = \lfloor \log_2(x/2^k + 1) \rfloor$, k indicating the order of the code and $\lfloor r \rfloor$ being maximum integer smaller than or equal to real value r. The EGk suffix part is computed as the binary representation of $x + 2^k(1 - 2^{l(x)})$ sing k+l(x) significant bits.

As can be seen from FIG. 4, the absolute data value x to be binarized is compared to the cut-off value S at 200 to determine the minimum of x and S. S is the cut-off value defining for which absolute data values x the truncated unary code is to be used exclusively, i.e. without using the Golomb binarization scheme for the residual. In other words, for all absolute data values x less than the cut-off values S the truncated unary binarization is used exclusively in order to map the absolute data value x to a codeword, the codeword accordingly merely consisting of a primary prefix. If the absolute data value x is greater than or equal to 5, a primary suffix is appended to the primary prefix, the primary suffix being created in accordance with a zero order Exp-Golomb binarization scheme from x−S, as will be described further below.

The minimum between x and S is binarized in accordance with the truncated unary binarization scheme at 202. The result is a primary prefix 204, which forms at least a part of the final codeword 206 to which x is mapped to. The primary prefix thus consists of a unary binarization of the value of Min(S, Abs(x)), where Min(a, b) denotes the minimum of values a and b, and where Abs(x) denotes the absolute value of x. In other words, primary prefix consists of S ones if x is greater than or equal to S, and consists of x leading ones followed by a terminating zero if x is less than S.

The absolute data value x is compared at 208 to the cut-off value S. If a comparison yields that x is smaller than S, the binarization ends at 210 and, therefore, the codeword 206, the absolute data value x is mapped to in accordance with the binarization scheme of FIG. 4, just consists of the primary prefix 204. Otherwise, i.e., if x is equal to or greater than S, the cut-off value S is subtracted from the absolute data value x at 212. The resulting difference x minus S, sometimes called a residual, is processed at 214 in accordance with a $k^{th}$ order Exp-Golomb binarization scheme, with k equal to zero. The $k^{th}$ order Exp-Golomb binarization scheme will later be described in more detail with respect to FIG. 7.

The result of the binarization 214 of the difference "x minus S" is appended to the primary prefix 204 as the primary suffix 208. Therefore, if the absolute data value x is greater than or equal to the cut-off value S the resulting codeword 206 consists of a primary prefix 204 followed by a primary suffix 208, wherein the primary suffix 208 is a $k^{th}$ order Exp-Golomb binarization n of x−S. As will be apparent from the further description, the primary suffix 208 itself consists of a prefix and a suffix, hereinafter called a secondary prefix 218 and a secondary suffix 220.

Experimental studies have shown, that for absolute values of transform coefficient levels, S=14 and k=0 yield relatively good compression ratios when passing such binarized transform coefficient level values to a binary arithmetic coder even if just the bits of the codewords 206 being part of the primary prefix are arithmetically coded using an adaptive probability model, thereby reducing the coding overhead.

FIG. 5 shows a table in which absolute values of transform coefficient levels in the left column 215 are listed with their corresponding codewords in accordance with the binarization if FIG. 4 to the right at 252, when S=14 and k=0. It is noted that the binarization and subsequent coding process is applied to the syntax element "transform coefficient level values minus 1", since zero valued, i.e. non-significant, transform coefficient levels are encoded using the aforementioned significances map. Therefore, with respect to FIG. 4, in the table of FIG. 5 at 250 the values of x plus 1 is listed. The table of FIG. 5 shows the result of the binarization scheme of FIG. 4 for the values S=14 and k=0.

As can be seen, the codeword or bin string, an absolute value is mapped to, comprises at least a TU prefix, the TU prefix part of the codewords or bin strings being highlighted in FIG. 5 at 254. As can be seen, absolute values below 15 (=x+1) do not have an EGO suffix as shown in 256. Further, as shown by dotted line 258 each EGO suffix 256 comprises a secondary prefix which is on the left side of dotted line 258, and all EGO suffixes 256, except the one of codeword belonging to absolute value 15, comprise a secondary suffix arranged to the right side of dotted line 258.

In the same way as FIG. 5, FIG. 6 shows a table of pairs of absolute values and bin strings as they are obtained in accordance with the binarization scheme of FIG. 4 with k=3 and S=9. The elements of the table of FIG. 6 being equal to those of FIG. 5 are indicated by the same reference numbers as in FIG. 5, and a repetitive description of these elements is omitted. The sign bit is not shown in table FIG. 6.

The values for k and s according to the binarization scheme in accordance with FIG. 6 has shown good compression effectiveness when applied to absolute components of motion vector differences. For motion vector differences UEGk binarization as shown in FIG. 6 is constructed as follows. Let us assume the value mvd of a motion vector component is given. For the prefix part of the UEGk bin string, a TU binarization (202 in FIG. 4) is invoked using the absolute value of mvd with a cut-off value of S=9. If mvd is equal to zero, the bin string consists only of the prefix code word "0", 270. If the condition $|mvd| \geq 9$ holds (208 in FIG. 4), the suffix is constructed (214 in FIG. 4) as an EG3 codeword for the value of $|mvd|-9$, to which the sign of mvd is appended using the sign bit "1" (not shown) for a negative mvd and the sign bit "0" (not shown) otherwise. For mvd values with $0<|mvd|<9$, the suffix consists only of the sign bit.

Assuming that the components of a motion vector difference represents the prediction error at quarter-sample accuracy, the prefix part always corresponds to a maximum error component of +/−2 samples. With the choice of the Exp-Golomb parameter k=3, the suffix code words are given such that a geometrical increase of the prediction error in units of 2 samples is captured by a linear increase in the corresponding suffix code word length.

After having described the functionality of binarizer 102 in FIG. 2 with respect to FIGS. 4 to 6 in a rather coarse way, a possible implementation for the $k^{th}$ order Exp-Golomb binarization 214 in FIG. 4 is described with respect to FIG. 7 in more detail. FIG. 7 shows a pseudo-C code illustrating the process of constructing the primary suffix part of the code word representing the binarization of absolute data value x in accordance with the binarization scheme of FIG. 4. First, at 300 an auxiliary parameter k is initialised to the order of the Exp-Golomb binarization used. In case of binarization of components of motion vector differences in accordance with FIG. 6, for example, k is initialized in step 300 to the value of 3.

If a comparison in line 302 between the absolute value of the motion vector difference (mvd) and the cut-.off value, here 9, reveals that the absolute value of mvd is greater than or equal to 9, in a step 304, the cut-off value S=9 is subtracted from the absolute value of mvd to obtain sufS. Furthermore, a parameter stopLoop is initialized in step 306 to the value of zero. Next, in 308, a conditional if-operation is performed as long as the stopLoop-parameter has not changed his value to a positive value greater than 0, as is checked in line 310. If the conditional if-operation reveals that sufS is greater than or equal to the $k^{th}$ power of 2 (312d), at 312 a bit having the bit value 1 is output (312a), the $k^{th}$ power of 2 is subtracted from sufS (312b), and k is incremented (312c). Otherwise, if sufS is smaller than the $k^{th}$ power of 2 (312e), a bit having the bit value of zero is output (312f), a binary representation of sufS using a number of bits equal to the actual value of k (312g) is output (312h), and the parameter stopLoop is set to a value of 1 (312e) thereby resulting in stopping the iterative execution of the if-operation 308.

All steps 304 to 312 are performed if the comparison in step 302 reveals that the absolute value of mvd is greater than or equal to 9. Irrespective of the comparison in 302, at 314 an a sign bit of zero is output if mvd is greater than zero and an a sign bit of 1 is output if mvd is smaller than zero, the sign bit not being shown in FIG. 6.

As becomes clear from the pseudo-C code of FIG. 7, in case of third order Exp-Golomb binarization scheme, the suffix part at least comprises four bits, one being the zero bit of 312f, and the other three being the bits of the binary representation output in 312h, as can be seen also in FIG. 6, neglecting the sign bit at the end of each codeword.

After having described with respect to FIG. 4 to 7 the binarization performed by binarizer 102 in FIG. 2, with respect to FIG. 8, the cooperation of the context modelling stage 100b and the arithmetic coding stage 100c is explained, which the binarized syntax elements are passed to.

FIG. 8 schematically shows at 350 a probability interval between $p_{low}$ and $p^{high}$, with $0 \leq p_{low} < p^{high} \leq 1$. The probability interval 350 represents an actual probability interval into which the combinations of the stages 100a to 100c have arithmetically coded leading syntax elements belonging to one slice. At the beginning of a slice, $p_{low}=0$ and $p^{high}=1$.

It is assumed that now the first bin of the syntax element binarized in accordance with the above-described binarization scheme is passed to the context modeling stage 100b. Let us assume that the syntax element is an absolute value of a transform coefficient level. The first bin in the binarization scheme for transform coefficient levels is, as can be seen in FIG. 5, in the last line of the table, and in FIG. 3, which shows the binarization code tree for the binarization scheme of FIG. 5, the first bit of the TV prefix of the binary string of the transform coefficient level. This bin is regularly past by switch 113 to context modeler 112. The context modeler 112 adjusts an adaptive probability estimation 352, according to which the first bin of the bin string has a probability of P(0) to be zero and a probability of P(1) to be one, wherein P(1)+P(0)=1. Context modeler 112 needs just one parameter in order to store or manage the adaptive probability estimation. Context modeler 112 adjusts the adaptive probability estimation in accordance with past bins or prior bins and in accordance with the context model type associated with the respective bin. The context model types defining the dependencies of the probability estimation on the past bins may be different for the different bins of the bin string of a syntax element. The context modeler 112 passes bin value and adjusted adaptive probability estimation 352 to regular coding engine 118. Regular coding engine 118 reduces the actual probability interval 350 to a new probability interval having a range of P(0) multiplicated with the range of the actual probability interval 350, i.e. with a range of $P(0)*(P_{high}-P_{low})$, if the bit value of the fist bin of the primary prefix is zero, and P(1) multiplicated with the range of the actual probability interval 350, i.e. with a range of $P(1)*(P_{high}-P_{low})$, if the first bit value of the first bit of the primary prefix is one. The new probability interval shares the lower limit with the actual probability interval 350, if the actual bin value of the first bin was zero, and the upper limit $P_{high}$ otherwise. In other words, the probability estimation virtually subdivides the actual interval in two subintervals, wherein the new actual probability interval is one of the two subintervals depending on the bin value to be encoded. Instead of assigning zero bin value to the lower subinterval, the lower subinterval could be associated with the most probable symbol (MPS), i.e. 1 or 0 depending on which has the higher probability according to the context model.

In the following example, the first bin value was zero, and therefore, the new actual probability interval, shown at 354 is obtained. The same procedure as for the first bin of the primary prefix is performed formed for the remaining bins of the primary prefix. Eventually a different context model type is used for different bins and the primary prefix. This means, the dependency of the adaptation of the probability estimation on prior bins may be different for the different bins and the primary prefix, including the use of different context templates etc.

As can be seen from FIG. 8, the actual probability interval is getting narrower and narrower. Each bin is directed by switch 113 to context modeler 112. This changes, when the first bit of the primary suffix reaches stage 100b. In this case, switch 113 passes the bin value to bypass coding engine 120. The bypass coding engine 120 operates on the same actual probability interval as regular coding engine 118, shown in FIG. 8 at 356. Contrary to the regular coding engine 118 the bypass coding engine 120 uses a fixed probability estimation or a static probability estimation, in particular, the fixed probability estimation used by bypass coding engine 120 assumes that the actual bin value is with equal probability a one or a zero, i.e. P(0)=P(1). Thus, bypass coding engine 120 reduces the actual probability interval 356 to either the upper or lower half of the actual probability interval 356 when coding the actual bin of the primary suffix.

As will be apparent from FIG. 8, the actual probability interval is reduced from bin to bin such that the new probability interval lies within the actual probability interval. The arithmetically coded bit stream that the regular coding engine and the bypass coding engine cooperatively output via switch 122 represents a probability value lying in the probability interval that is obtained after operating the syntax element of a whole slice.

As already mentioned above, the compression rate of the output string is relatively high taking into account the computational reduction with respect to the adaptive probability estimation context modeling.

After having described the binarization and arithmetic coding on the encoder side in accordance with embodiments of the present invention, FIG. 9 shows as an embodiment of the present invention, the steps performed on decoder side in order to decode the arithmetically coded bit stream.

Firstly, in step 400, the decoder receiving the arithmetically coded bit stream determines whether the next bin or bit to be determined from the coded bit stream is an primary prefix bit or an primary suffix bit. The decoder knows from the way of the predetermined syntax of the arithmetically coded bit stream, as to whether the next bin or bit expected is a bit of a primary prefix or a primary suffix of a binarized syntax element.

If, in step 400, it is determined that the expected bit is a bit of the primary prefix, the decoder determines the bit value for this bit by binary arithmetic decoding based on an adaptively varying probability estimation or context model. The decoder updates this adaptively varying probability estimation based on past decoded bins indicated by the respective context model type. The determination 402 includes subdividing an actual probability interval according to the adaptive probability estimation into two subintervals, assigning the bin value to be determined to the bin value associated with the subinterval the probability value indicated by the arithmetically coded bit stream lies in, and reducing the actual probability interval to the that subinterval, thereby simulating the steps performed by the encoder when creating the arithmetically coded bit stream as shown in FIG. 8.

If the bit is a bit of the primary suffix, in 404 the next bit or bin value is determined by performing arithmetic decoding based on a static probability model. Step 404 includes subdividing the actual probability interval according to the static probability estimation into two equally sized subintervals, assigning the bin value to be determined to the bit value associated with the subinterval in which the probability value indicated by the arithmetically coded bit stream lies, and reducing the actual probability interval to that subinterval.

The decoder repeats, 408, the steps 400 to 404 if there are bits left to achieve the bit values for the bits of a whole codeword. If there are no bits left at step 408, the decoding process ends at step 410. The decoder knows when the binary representation of a syntax element ends, i.e. which decoded bit is the last of a actual syntax element, from following the respective binarization code tree, such as the code tree shown in FIG. 3 in case of the syntax element being a absolute transform coefficient level minus 1.

FIG. 10 shows the process of recovering from the codeword as obtained by the process of FIG. 9 the data value, which has been binarized into the codeword. The bit values as obtained by the process of FIG. 9 form a bit stream 450. The decoder knows, as described above when a new code word is on the bit stream 450, the instance of a new codeword being indicated by way of a signal 452.

In a minimum extracting step 454 then a value m is extracted from the binary code word by counting the leading ones in the primary prefix of the code word, the count being equal to m. If m is equal to S, what is checked in step 456 (the value of S is known to the decoder because he knows which syntax element is coded by which binarization scheme), in a difference extracting step 458 the bits following to the bits of the primary prefix from the bit stream 450 are received, which form the primary suffix part of the code word. In the difference extracting step 458 the difference between the data value x to be recover and the cut-off value S is recovered from the primary suffix of the code word in the bit stream 450.

In step 460, S is added to the difference x–S recovered in step 358 to obtain the value x, the value for the actually encoded syntax element.

An example for a pseudo-C code illustrating minimum extraction step 454 could be:
m=–1; /Initializing counting parameter
  for (b=0; (b–1); m++) ( /Bitwise reading the leading bits of
    b=read_bits (1); /codeword and, before each reading,
    if (M=S) /incrementing k, until the actually
    b=0; /read bit is zero or m=S
)

The substeps performed by in difference extracting step 458 are shown in FIG. 11. In a step 500 the difference extractor counts the leading bits in the primary suffix to obtain a value m. Next, k, which is 3 for motion vector difference and is 0 for a transform coefficient level value, is compared to zero in step 502. If k is equal to zero, in step 504, m is compared to zero in step 504. If comparison yield that m=0, it is deduced in step 506 that the data value x is equal to the cut-off value S, which is 9 in the case of motion vector differences and 14 in the case of transform coefficient levels.

If k is not equal to zero and/or m is not equal to zero, in step 508 the next k plus m following bits are read from the bit stream 450, i.e. the bits following the terminating bit of the secondary prefix. Thereby, a binary (k+m) bit long representation of $A=x-S+2^k (1-2^m)$ is achieved. As can easily gathered form this equation, $A=x-S$ if m=0.

When a comparison of m with 0 in step 510 reveals that m=0, from the binary representation A the value of $2^k(1-2^m)$ is subtracted to obtain the value of x–S.

In the following, reference is made to FIG. 12 to show, in more detail than in FIG. 1, the complete setup of a video encoder engine including an entropy-encoder as it is shown in FIG. 12 in block 800 in which the aforementioned binarization and binary arithmetic coding is used. In particular, FIG. 12 shows the basic coding structure for the emerging H.264/AVC standard for a macroblock. The input video signal is, split into macroblocks, each macroblock having 16×16 pixels. Then, the association of macroblocks to slice groups and slices is selected, and, then, each macroblock of each slice is processed by the network of operating blocks in FIG. 12. It is to be noted here that an efficient parallel processing of macroblocks is possible, when there are various slices in the picture. The association of macroblocks to slice groups and slices is performed by means of a block called coder control 802 in FIG. 12. There exist several slices, which are defined as follows:

I slice: A slice in which all macroblocks of the slice are coded using intra prediction.

P slice: In addition, to the coding types of the I slice, some macroblocks blocks of the P slice can also be coded using inter prediction with at most one motion-compensated prediction signal per prediction block.

B slice: In addition, to the coding types available in a P slice, some macroblocks of the B slice can also be coded using inter prediction with two motion-compensated prediction signals per prediction block.

The above three coding types are very similar to those in previous standards with the exception of the use of reference pictures as described below. The following two coding types for slices are new:

SP slice: A so-called switching P slice that is coded such that efficient switching between different precoded pictures becomes possible.

SI slice: A so-called switching I slice that allows an exact match of a macroblock in an SP slice for random access and error recovery purposes.

Slices are a sequence of macroblocks, which are processed in the order of a raster scan when not using flexible macroblock ordering (FMO). A picture maybe split into one or several slices as shown in FIG. 14. A picture is therefore a collection of one or more slices. Slices are self-contained in the sense that given the active sequence and picture parameter sets, their syntax elements can be parsed from the bit stream and the values of the samples in the area of the picture that the slice represents can be correctly decoded without use of data from other slices provided that utilized reference pictures are identical at encoder and decoder. Some information from other slices may be needed to apply the deblocking filter across slice boundaries.

FMO modifies the way how pictures are partitioned into slices and macroblocks by utilizing the concept of slice groups. Each slice group is a set of macroblocks defined by a macroblock to slice group map, which is specified by the content of the picture parameter set and some information from slice headers. The macroblock to slice group map consists of a slice group identification number for each macroblock in the picture, specifying which slice group the associated macroblock belongs to. Each slice group can be partitioned into one or more slices, such that a slice is a sequence of macroblocks within the same slice group that is processed in the order of a raster scan within the set of macroblocks of a particular slice group. (The case when FMO is not in use can be viewed as the simple special case of FMO in which the whole picture consists of a single slice group.)

Using FMO, a picture can be split into many macroblock-scanning patterns such as interleaved slices, a dispersed macroblock allocation, one or more "foreground" slice groups and a "leftover" slice group, or a checker-board type of mapping.

Each macroblock can be transmitted in one of several coding types depending on the slice-coding type. In all slice-coding types, the following types of intra coding are supported, which are denoted as Intra_4×4 or Intra_16×16 together with chroma prediction and I_PCM prediction modes.

The Intra_4×4 mode is based on predicting each 4×4 luma block separately and is well suited for coding of parts of a picture with significant detail. The Intra_16×16 mode, on the other hand, does prediction of the whole 16×16 luma block and is more suited for coding very smooth areas of a picture.

In addition, to these two types of luma prediction, a separate chroma prediction is conducted. As an alternative to Intra_4×4 and Intra_16×16, the I_PCM coding type allows the encoder to simply bypass the prediction and transform coding processes and instead directly send the values of the encoded samples. The I_PCM mode serves the following purposes:

1. It allows the encoder to precisely represent the values of the samples
2. It provides a way to accurately represent the values of anomalous picture content without significant data expansion
3. It enables placing a hard limit on the number of bits a decoder must handle for a macroblock without harm to coding efficiency.

In contrast to some previous video coding standards (namely H.263+ and MPEG-4 Visual), where intra prediction has been conducted in the transform domain, intra prediction in H.264/AVC is always conducted in the spatial domain, by referring to the bins of neighboring samples of previously coded blocks which are to the left and/or above the block to be predicted. This may incur error propagation in environments with transmission errors that propagate due to motion compensation into inter-coded macroblocks. Therefore, a constrained intra coding mode can be signaled that allows prediction only from intra-coded neighboring macroblocks.

When using the Intra_4×4 mode, each 4×4 block is predicted from spatially neighboring samples as illustrated on the left-hand side of FIG. 15. The 16 samples of the 4×4 block, which are labeled as a–p, are predicted using prior decoded samples in adjacent blocks labeled as A–Q. For each 4×4 block one of nine prediction modes can be utilized. In addition, to "DC" prediction (where one value is used to predict the entire 4×4 block), eight directional prediction modes are specified as illustrated on the right-hand side of FIG. 15. Those modes are suitable to predict directional structures in a picture such as edges at various angles.

In addition, to the intra macroblock coding types, various predictive or motion-compensated coding types are specified as P macroblock types. Each P macroblock type corresponds to a specific partition of the macroblock into the block shapes used for motion-compensated prediction. Partitions with luma block sizes of 16×16, 16×8, 8×16, and 8×8 samples are supported by the syntax. In case partitions with 8×8 samples are chosen, one additional syntax element for each 8×8 partition is transmitted. This syntax element specifies whether the corresponding 8×8 partition is further partitioned into partitions of 8×4, 4×8, or 4×4 luma samples and corresponding chroma samples.

The prediction signal for each predictive-coded M×N luma block is obtained by displacing an area of the corresponding reference picture, which is specified by a translational motion vector and a picture reference index. Thus, if the macroblock is coded using four 8×8 partitions and each 8×8 partition is further split into four 4×4 partitions, a maximum of sixteen motion vectors may be transmitted for a single P macroblock.

The quantization parameter SliceQP is used for determining the quantization of transform coefficients in H.264/AVC. The parameter can take 52 values. Theses values are arranged so that an increase of 1 in quantization parameter means an increase of quantization step size by approximately 12% (an increase of 6 means an increase of quantization step size by exactly a factor of 2). It can be noticed that a change of step size by approximately 22% also means roughly a reduction of bit rate by approximately 12%.

The quantized transform coefficients of a block generally are scanned in a zig-zag fashion and transmitted using entropy coding methods. The 2×2 DC coefficients of the chroma component are scanned in raster-scan order. All inverse transform operations in Kb 264/AVC can be implemented using only additions and bit-shifting operations of 16-bit integer values. Similarly, only 16-bit memory accesses are needed for a good implementation of the forward transform and quantization process in the encoder.

The entropy encoder 800 in FIG. 8 in accordance with a coding arrangement of FIG. 2. A context modeler feeds a context model, i.e., a probability information, to an arithmetic encoder, which is also referred to as the regular coding engine. The to be encoded bit, i.e. a bin, is forwarded from the context modeler to the regular coding engine. This bin value is also fed back to the context modeler so that a context model update can be obtained. A bypass branch is provided, which includes an arithmetic encoder, which is also called the bypass coding engine. The bypass coding engine is operative to arithmetically encode the input bin values. Contrary to the regular coding engine, the bypass coding engine is not an adaptive coding engine but works preferably with a fixed probability model without any context adaption. A selection of the two branches can be obtained by means of switches. The binarizer device is operative to binarize non-binary valued syntax elements for obtaining a bin string, i.e., a string of binary values. In case the syntax element is already a binary value syntax element, the binarizer 78 is bypassed.

Therefore, in CABAC (CABAC=Context-based Adaptive Binary Arithmetic Coding) the encoding process consists of at most three elementary steps:

1. binarization
2. context modeling
3. binary arithmetic coding

In the first step, a given non-binary valued syntax element is uniquely mapped to a binary sequence, a so-called bin string. When a binary valued syntax element is given, this, initial step is bypassed, as shown in FIG. 2. For each element of the bin string or for each binary valued syntax element, one or two subsequent steps may follow depending on the coding mode.

In the so-called regular coding mode, prior to the actual arithmetic coding process the given binary decision, which, in the sequel, we will refer to as a bin, enters the context modeling stage, where a probability model is selected such that the corresponding choice may depend on previously encoded syntax elements or bins. Then, after the assignment of a context model the bin value along with its associated model is passed to the regular coding engine, where the final stage of arithmetic encoding together with a subsequent model updating takes place (see FIG. 2).

Alternatively, the bypass coding mode is chosen for selected bins in order to allow a speedup of the whole encoding (and decoding) process by means of a simplified coding engine without the usage of an explicitly assigned model. This mode is especially effective when coding the bins of the primary suffix of those syntax elements, concerning components of differences of motion vectors and transform coefficient Levels.

In the following, the three main functional building blocks, which are binarization, context modeling, and binary arithmetic coding in the encoder of FIG. 12, along with their inter-dependencies are discussed in more detail.

In the following, several details on binary arithmetic coding will be set forth.

Binary arithmetic coding is based on the principles of recursive interval subdivision that involves the following elementary multiplication operation. Suppose that an estimate of the probability $P_{LPS} \in (0, 0.5]$ of the least probable symbol (LPS) is given and that the given interval is represented by its lower bound L and its width (range) R. Based on that settings, the given interval is subdivided into two sub-intervals: one interval of width $$R_{LPS} = R \times P_{LPS},$$

which is associated with the LPS, and the dual interval of width $R_{MPS} = R - R_{LPS}$, which is assigned to the most probable symbol (MPS) having a probability estimate of $1 - p_{LPS}$. Depending on the observed binary decision, either identified as the LPS or the MPS, the corresponding sub-interval is then chosen as the new current interval. A binary value pointing into that interval represents the sequence of binary decisions processed so far, whereas the range of the interval corresponds to the product of the probabilities of those binary symbols. Thus, to unambiguously identify that interval and hence the coded sequence of binary decisions, the Shannon lower bound on the entropy of the sequence is asymptotically approximated by using the minimum precision of bits specifying the lower bound of the final interval.

An important property of the arithmetic coding as described above is the possibility to utilize a clean interface between modeling and coding such that in the modeling stage, a model probability distribution is assigned to the given symbols, which then, in the subsequent coding stage, dives the actual coding engine to generate a sequence of bits as a coded representation of the symbols according to the model distribution. Since it is the model that determines the code and its efficiency in the first place, it is of importance to design an adequate model that explores the statistical dependencies to a large degree and that this model is kept "up to date" during encoding. However, there are significant model costs involved by adaptively estimating higher-order conditional probabilities. These costs are reduced by use of the binarization schemes as described above.

Suppose a pre-defined set T, of past symbols, a so-called context template, and a related set $c=(0, \ldots, C-1)$ of contexts is given, where the contexts are specified by a modeling function F. For each symbol x to be coded, a conditional probability $p(x|F(z))$ is estimated by switching between different probability models according to the already coded neighboring symbols $z \in T$. After encoding x using the estimated conditional probability ability $p(x|F(z))$ is estimated on the fly by tracking the actual source statistics. Since the number of different conditional probabilities to be estimated for an alphabet size of m is high, it is intuitively clear that the model cost, which represents the cost of "learning" the model distribution, is proportional to the number of past symbols to the power of four.

This implies that by increasing the number C of different context models, there is a point, where overfitting of the model may occur such that inaccurate estimates of $p(x|F(z))$ will be the result.

This problem is solved in the encoder of FIG. 12 by imposing two severe restrictions on the choice of the context models. First, very limited context templates T consisting of a few neighbors of the current symbol to encode are employed such that only a small number of different context models C is effectively used.

Secondly, context modeling is restricted to selected bins of the binarized symbols as mentioned above and is of especially advantage with respect to primary prefix and suffix of the motion vector differences and the transform coefficient levels but which is also true for other syntax elements. As a result, the model cost is drastically reduced, even though the ad-hoc design of context models under these restrictions may not result in the optimal choice with respect to coding efficiency.

Four basic design types of context models can be distinguished. The first type involves a context template with up to two neighboring syntax elements in the past of the current syntax element to encode, where the specific definition of the kind of neighbor depends on the syntax element. Usually, the specification of this kind of context model for a specific bin is based on a modeling function of the related bin values for the neighboring element to the left and on top of the current syntax element, as shown in FIG. 13.

The second type of context models is only defined for certain data subtypes. For this kind of context models, the values of prior coded bins $(b_0, b_1, b_2, \ldots, b_{i-1})$ are used for the choice of a model for a given bin with index i. Note that these context models are used to select different models for different internal nodes of a corresponding responding binary tree.

Both the third and fourth type of context models is applied to residual data only. In contrast to all other types of context models, both types depend on context categories of different block types. Moreover, the third type does not rely on past coded data, but on the position in the scanning path. For the fourth type, modeling functions are specified that involve the evaluation of the accumulated number of encoded (decoded) levels with a specific value prior to the current level bin to encode (decode).

Besides these context models based an conditional probabilities, there are fixed assignments of probability models to bin indices for all those bins that have to be encoded in regular mode and to which no context model of the previous specified category can be applied.

The above described context modeling is suitable for a video compression engine such as video compression/ decompression engines designed in accordance with the presently emerging H.264/AVC video compression standard. To summarize, for each bin of a bin string the context modeling, i.e., the assignment of a context variable, generally depends on the to be processed data type or sub-data type, the precision of the binary decision inside the bin string as well as the values of previously coded syntax elements or bins. With the exception of special context variables, the probability model of a context variable is updated after each usage so that the probability model adapts to the actual symbol statistics.

An specific example for a context-based adaptive binary arithmetic coding scheme to which the above binarization scheme could be applied is described in: D. Marpe, G. Blattermann, and T. Wiegand, "Adaptive codes for H.26L," ITU-T SG16/Q.6 Doc. VCEG-L13, Eibsee, Germany, Jan. 2003, 07–10, which is incorporated herein by reference.

It is noted that the inventive binarization concept is not at all restricted to the use in arithmetic coding. It may be used advantageously also in other applications and in particular applied to data values, such as any transform coefficients or the like. Moreover, the binarization may be useful not only with respect to arithmetic coding but also in connection with other data processing schemes.

With respect to the bit values, bin strings, codewords and so on, given above, it is noted that same max be switched. Moreover, with respect to the primary prefix and suffix, the bits may be switched with respect to one of them and left unchanged with respect to the other.

Depending on an actual implementation, the inventive encoding/decoding and bin binarization/recovering methods can be implemented in hardware or in software. Therefore, the present invention also relates to a computer program, which can be stored on a computer-readable medium such as a CD, a disk or any other data carrier. The present invention is, therefore, also a computer program having a program code which, when executed on a compute, performs the inventive method of encoding or binarizing or the inventive method of decoding or recovering described in connection with the above figures.

What is claimed is:

1. A method for binarizing a data value, the method comprising the following steps:
   a) binarizing the minimum of the data value and a predetermined cut-off value in accordance with a first binarization scheme, in order to yield a primary prefix;
   if the data value is greater than the cut-off value,
   b) binarizing a difference of the data value minus the predetermined cut-off value in accordance with a second binarization scheme to obtain a binary suffix, the first binarization scheme being different from the second binarization scheme; and
   c) appending the primary suffix to the primary prefix.

2. The method in accordance with claim 1, wherein the first binarization scheme is a truncated unary binarization scheme merely defined for values between zero and the predetermined cut-off value.

3. The method in accordance with claim 1, wherein the second binarization scheme is a $k^{th}$ order exponential Golomb binarization scheme with k being an integer greater than or equal to zero.

4. The method in accordance with claim 1, wherein step a) is performed such that the primary prefix consists of s bits having a first bit value, if the minimum is equal to the predetermined cut-off value, where s is an integer greater than or equal to the predetermined cut-off value, and, otherwise, the primary prefix consists of a number of n of bits having the first bit value followed by a bit having a second bit value different to the first bit value, wherein n is an integer greater than or equal to zero, with n being smaller than s, and n being unique to all possible values said minimum may assume.

5. The method in accordance with claim 4, wherein s is the predetermined cut-off value.

6. The method in accordance with claim 1, wherein step b) comprises the following steps:
   d) subtracting the predetermined cut-off value from the data value to obtain a residual data value;
   e) generating a secondary prefix consisting of a number m of bits having a third bit value, with $m=\lfloor \log_2(x/2^k+1) \rfloor$, where x is the residual data value, k is a predetermined integer value greater than or equal to zero, the m bits having the third bit value being followed by a bit having a fourth bit value being different from the third bit value;
   f) generating a secondary suffix being a k+m bit long binary representation of $x+2^k(1-2^m)$; and
   g) appending the secondary suffix to the secondary prefix to obtain the primary suffix.

7. The method in accordance with claim 6, wherein k is equal to 3.

8. The method in accordance with claim 7, wherein the data value is the absolute value of a component of a motion vector difference in a precoded representation video signal.

9. The method in accordance with claim 8, wherein the cutoff value is 9.

10. The method in accordance with claim 6, wherein k is equal to 1.

11. The method in accordance with claim 10, wherein the data value is the absolute value of a transform coefficient level minus 1 in a precoded representation video signal.

12. The method in accordance with claim 11, wherein the cutoff value is 15.

13. The method in accordance with claim 6, wherein step f) comprises the following steps:
   h) initializing k to the predetermined integer value;
   i) comparing the residual data value to the $k^{th}$ power of 2;
   j) if the residual data value is greater than or equal to the $k^{th}$ power of 2,
   outputting a bit having the third bit value;
   decreasing the residual data value by the $k^{th}$ power of 2; and
   implementing k;
   otherwise,
   outputting a bit having the forth bit value; and
   outputting bits forming a k bit long binary representation of the residual data value;
   repeating steps i) to k) until once performing the step of outputting the bits forming the binary representation of the residual value.

14. A method for recovering a data value from a binarized representation of the data value, the binarized representation of the data value being a codeword having a primary prefix, which is a binarization of the minimum of the data value and a predetermined cut-off value accordance with a first binarization scheme and, if the data value is greater than the predetermined cut-off value, a primary suffix appended to the primary prefix, the primary suffix being a binarization of the difference of the data value minus the predetermined cut-off value in accordance with a second binarization scheme, the method comprising the following steps:
   a) extracting, from the primary prefix, the minimum;
   if the minimum is equal to the cut-off value,
   b) extracting, from the primary suffix, the difference from the data value minus the predetermined cut-off value; and c) adding the predetermined cut-off value to the difference, to obtain the data value; and if the minimum is smaller than the cut-off value, d) regarding the minimum as the data value.

15. The method in accordance with claim 14, wherein the primary prefix consists of s bits having a first bit value, if the minimum is equal to the predetermined cut-off value, where s is an integer greater than or equal to the predetermined cut-off value, and, otherwise, the primary prefix consists of a number of n of bits having the first bit value followed by a bit having a second bit value different to the first bit value, wherein n is an integer greater than or equal to zero, with n being smaller than s, and n being unique to all possible values the minimum may assume, and wherein step a) comprises:

counting the leading bits having the first bit value in the codeword until a terminating bit having the second bit value to obtain the minimum.

16. The method in accordance with claim 14, wherein in the step of counting the count is taken as the minimum.

17. The method in accordance with claim 14, wherein the primary suffix consists of a secondary suffix appended to a secondary prefix, the secondary prefix consisting of a number m of bits having a third bit value with $m=\lfloor \log_2(x/2^k+1) \rfloor$, where x is a residual data value and is equal to the difference of the data value minus the predetermined cutoff value, k is a predetermined integer value greater than or equal to zero, the m bits having the third bit value being followed by a bit having a fourth bit value being different from the third bit value, and the secondary suffix being a k+m bit long binary representation of $x+2^k(1-2^m)$, wherein step b) comprises the following steps:

counting the leading bits having the third bit value of the primary suffix until the terminating bit having the forth bit value to obtain the value of m;

if m=0 and k=0, assuming that the data value is equal to the predetermined cut-off value;

if neither m nor k is equal to zero, reading k+m bits following the terminating bit to obtain a value of $x+2^k (1-2^m)$; and subtracting $2^k (1-2^m)$ from the value of $x+2^k (2-2^m)$ to obtain the residual data value; and if m is zero but k is not equal to zero, reading k bits following the terminating bit to obtain the value of the residual data value.

18. A method for arithmetically coding a data value into a coded bit stream, the method comprising the following steps:

a) binarizing the minimum of the data value and a predetermined cut-off value in accordance with a first binarization scheme, in order to yield a primary prefix;

if the data value is greater than the cut-off value, b) binarizing a difference of the data value minus the predetermined cut-off value in accordance with a second binarization scheme to obtain a binary suffix, the first binarization scheme being different from the second binarization scheme; and c) appending the primary suffix to the primary prefix;

for each bit in the codeword, if the bit of the code word is part of the primary prefix, binary arithmetically coding the bit by means of a adaptively varying bit value probability estimation; and if the bit of the code word is part of the primary suffix, binary arithmetically coding the bit by means of a static bit value probability estimation, thereby obtaining the coded bit stream.

19. The method in accordance with claim 18, wherein the adaptively varying bit value probability estimation varies in accordance with a predetermined context model dependent on past coded bits.

20. Method for decoding a coded bit stream which represents a binarized representation of the data value, the binarized representation of the data value being a codeword having a primary prefix, which is a binarization of the minimum of the data value and a predetermined cut-off value in accordance with a first binarization scheme and, if the data value is greater than the predetermined cut-off value, a primary suffix appended to the primary prefix, the primary suffix being a binarization of the difference of the data value minus the predetermined cut-off value in accordance with a second binarization scheme, the method comprising the following steps:

for each bit in the codeword, if the bit of the codeword is part of the primary prefix, determining the bit by binary arithmetically decoding the coded bit stream by means of a adaptively varying bit value probability estimation; and if the bit of the codeword is part of the primary suffix, determining the bit by binary arithmetically decoding the bit by means of a static bit value probability estimation, thereby obtaining the codeword;

extracting, from the primary prefix, the minimum;

if the minimum is equal to the cut-off value, extracting, from the primary suffix, the difference from the data value minus the predetermined cut-off value; and adding the predetermined cut-off value to the difference, to obtain the data value; and if the minimum is smaller than the cut-off value, regarding the minimum as the data value.

21. An Apparatus for binarizing a data value, comprising a means for binarizing the minimum of the data value and a predetermined cut-off value in accordance with a first binarization scheme, in order to yield a primary prefix; and a means for, if the data value is greater than the cut-off value, binarizing a difference of the data value minus the predetermined cut-off value in accordance with a second binarization scheme to obtain a binary suffix, the first binarization scheme being different from the second binarization scheme, and appending the primary suffix to the primary prefix.

22. An Apparatus to recovering a data value from a binarized representation of the data value, the binarized representation of the data value being a codeword having a primary prefix, which is a binarization of the minimum of the data value and a predetermined cut-off value in accordance with a first binarization scheme and, if the data value is greater than the predetermined cut-off value, a primary suffix appended to the primary prefix, the primary suffix being a binarization of the difference of the data value minus the predetermined cut-off value in accordance with a second binarization scheme, the apparatus comprising a means for extracting, from the primary prefix, the minimum; and a means for, if the minimum is equal to the cut-off value, extracting, from the primary suffix, the difference from the data value minus the predetermined cut-off value; and adding the predetermined cut-off value to the difference, to obtain the data value, and, if the minimum is smaller than the cut-off value, regarding the minimum as the data value.

23. An Apparatus for arithmetically coding a data value into a coded bit stream, the apparatus comprising means for binarizing the minimum of the data value and a predetermined cut-off value in accordance with a first binarization scheme, in order to yield a primary prefix;

means for, if the data value is greater than the cut-off value, binarizing a difference of the data value minus the predetermined cut-off value in accordance with a second binarization scheme to obtain a binary suffix, the first binarization scheme being different from the second binarization scheme, and appending the primary suffix to the primary prefix; and means for, for each bit in the codeword, if the bit of the code word is part of the primary prefix, binary arithmetically coding the bit by means of a adaptively varying bit value probability estimation, and for, if the bit of the code word is part of the primary suffix, binary arithmetically coding the bit by means of a static bit value probability estimation, thereby obtaining the coded bit stream.

24. Apparatus for decoding a coded bit stream which represents a binarized representation of the data value, the binarized representation of the data value being a codeword having a primary prefix, which is a binarization of the minimum of the data value and a predetermined cut-off value in accordance with a first binarization scheme and, if the data value is greater than the predetermined cut-off value, a primary suffix appended to the primary prefix, the primary suffix being a binarization of the difference of the data value minus the predetermined cut-off value in accordance with a second binarization scheme, comprising:

means for, for each bit in the codeword,
if the bit of the codeword is part of the primary prefix, determining the bit by binary arithmetically decoding the coded bit stream by means of a adaptively varying bit value probability estimation; and
if the bit of the codeword is part of the primary suffix, determining the bit by binary arithmetically decoding the bit by means of a static bit value probability estimation,
thereby obtaining the codeword;

means for extracting, from the primary prefix, the minimum; and means for, if the minimum is equal to the cut-off value,
extracting, from the primary suffix, the difference from the data value minus the predetermined cut-off value; and
adding the predetermined cut-off value to the difference, to obtain the data value; and
if the minimum is smaller than the cut-off value,
regarding the minimum as the data value.

25. Computer program having instructions for performing, when running on a computer, a method for binarizing a data value, the method comprising the following steps:

a) binarizing the minimum of the data value and a predetermined cut-off value in accordance with a first binarization scheme, in order to yield a primary prefix;
if the data value is greater than the cut-off value, b) binarizing a difference of the data value minus the predetermined cut-off value in accordance with a second binarization scheme to obtain a binary suffix, the first binarization schema being different from the second binarization scheme; and c) appending the primary suffix to the primary prefix.

26. Computer program having instructions for performing, when running on a computer, a method for recovering a data value from a binarized representation of the data value, the binarized representation of the data value being a codeword having a primary prefix, which is a binarization of the minimum of the data value and a predetermined cut-off value in accordance with a first binarization scheme and, if the data value is greater than the predetermine cut-off value, a primary suffix appended to the primary prefix, the primary suffix being a binarization of the difference of the data value minus the predetermined cut-off value in accordance with a second binarization scheme, the method comprising the following steps:

b) extracting, from the primary prefix, the minimum;
if the minimum is equal to the cut-off value,
b) extracting, from the primary suffix, the difference from the data value minus the predetermined cut-off value; and
c) adding the predetermined cut-off value to the difference, to obtain the data value; and
if the minimum is smaller than the cut-off value,
d) regarding the minimum as the data value.

27. Computer program having instructions for performing, when running on a computer, a method for decoding a coded bit stream which represents a binarized representation of the data value, the binarized representation of the data value being a codeword having a primary prefix, which is a binarization of the minimum of the data value and a predetermined cut-off value in accordance with a first binarization scheme and, if the data value is greater than the predetermined cut-off value, a primary suffix appended to the primary prefix, the primary suffix being a binarization of the difference of the data value minus the predetermined cut-off value in accordance with a second binarization scheme, the method comprising the following steps:

for each bit in the codeword,
if the bit of the codeword is part of the primary prefix, determining the bit by binary arithmetically decoding the coded bit stream by means of a adaptively varying bit value probability estimation; and
if the bit of the codeword is part of the primary suffix, determining the bit by binary arithmetically decoding the bit by means of a static bit value probability estimation,
thereby obtaining the codeword;
extracting, from the primary prefix, the minimum;
if the minimum is equal to the cut-off value,
extracting, from the primary suffix, the difference from the data value minus the predetermined cut-off value; and
adding the predetermined cut-off value to the difference, to obtain the data value; and
if the minimum is smaller than the cut-off value,
regarding the minimum as the data value.

* * * * *